(12) United States Patent
Suzuki

(10) Patent No.: US 11,838,670 B2
(45) Date of Patent: Dec. 5, 2023

(54) IMAGING ELEMENT AND IMAGING APPARATUS

(71) Applicant: SONY SEMICONDUCTOR SOLUTIONS CORPORATION, Kanagawa (JP)

(72) Inventor: Misao Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 13 days.

(21) Appl. No.: 17/310,797

(22) PCT Filed: Feb. 21, 2020

(86) PCT No.: PCT/JP2020/007045
§ 371 (c)(1),
(2) Date: Aug. 24, 2021

(87) PCT Pub. No.: WO2020/184149
PCT Pub. Date: Sep. 17, 2020

(65) Prior Publication Data
US 2022/0124277 A1  Apr. 21, 2022

(30) Foreign Application Priority Data
Mar. 11, 2019 (JP) ................. 2019-043786

(51) Int. Cl.
*H04N 25/772*  (2023.01)
*H04N 25/75*  (2023.01)
*H04N 25/778*  (2023.01)

(52) U.S. Cl.
CPC .......... *H04N 25/772* (2023.01); *H04N 25/75* (2023.01); *H04N 25/778* (2023.01)

(58) Field of Classification Search
None
See application file for complete search history.

(56) References Cited

U.S. PATENT DOCUMENTS 9,137,432 B2 * 9/2015 Ahn ................. H04N 23/70
9,876,975 B2   1/2018 Daisuke
(Continued)

FOREIGN PATENT DOCUMENTS

CN  105828003 A  8/2016
CN  108702471 A  10/2018
(Continued)

OTHER PUBLICATIONS

International Search Report and Written Opinion of PCT Application No. PCT/JP2020/007045, dated Mar. 24, 2020, 10 pages of ISRWO.
(Continued)

*Primary Examiner* — Mark T Monk
(74) *Attorney, Agent, or Firm* — CHIP LAW GROUP

(57) ABSTRACT

An imaging element according to an embodiment of the present disclosure includes a plurality of sensor pixels and a voltage control section. The sensor pixels each include a photoelectric conversion section, and a readout circuit that outputs a pixel signal based on charges outputted from the photoelectric conversion section. The voltage control section applies a control voltage based on the pixel signal to a plurality of the photoelectric conversion sections.

10 Claims, 25 Drawing Sheets

(56) References Cited

U.S. PATENT DOCUMENTS

| | | |
|---|---|---|
| 2013/0076933 A1 | 3/2013 | Chak |
| 2016/0219229 A1 | 7/2016 | Kimura |
| 2018/0175103 A1 | 6/2018 | Ryoki et al. |
| 2018/0184020 A1* | 6/2018 | Vampola .............. H04N 25/767 |

FOREIGN PATENT DOCUMENTS

| | | |
|---|---|---|
| EP | 3425900 A1 | 1/2019 |
| JP | 2016-134909 A | 7/2016 |
| JP | 2018-098690 A | 6/2018 |
| KR | 10-2018-0117601 A | 10/2018 |
| TW | I386046 B | 2/2013 |
| WO | 2017/150167 A1 | 9/2017 |

OTHER PUBLICATIONS

Office Action for Taiwan Patent Application No. 109105793 dated Sep. 28, 2023.

* cited by examiner

[FIG. 1]
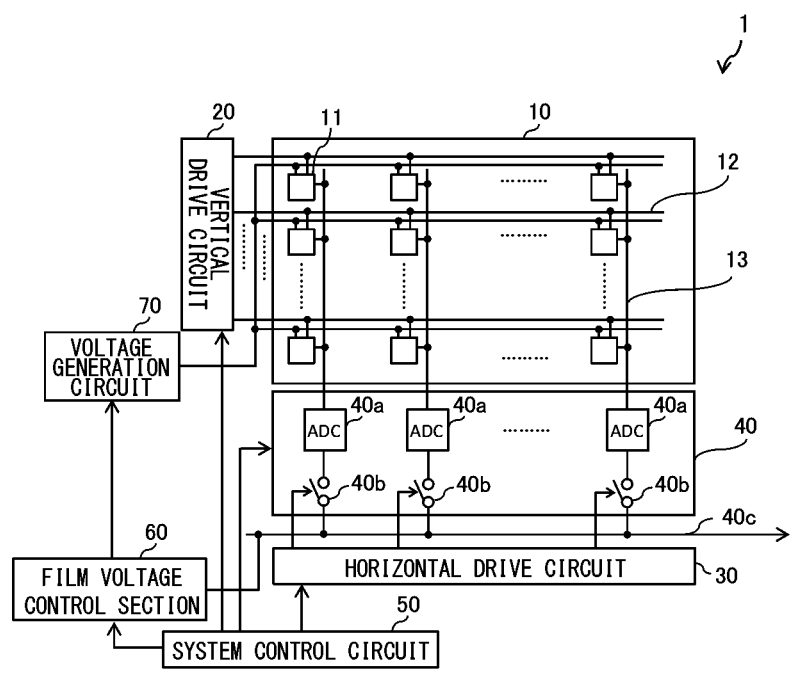

[FIG. 2]
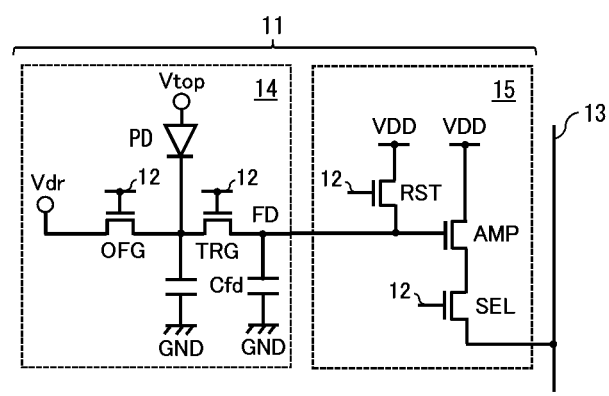
[FIG. 3]
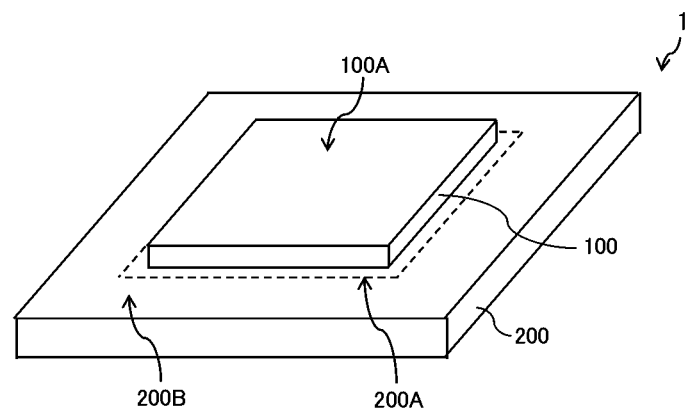

[FIG. 4]
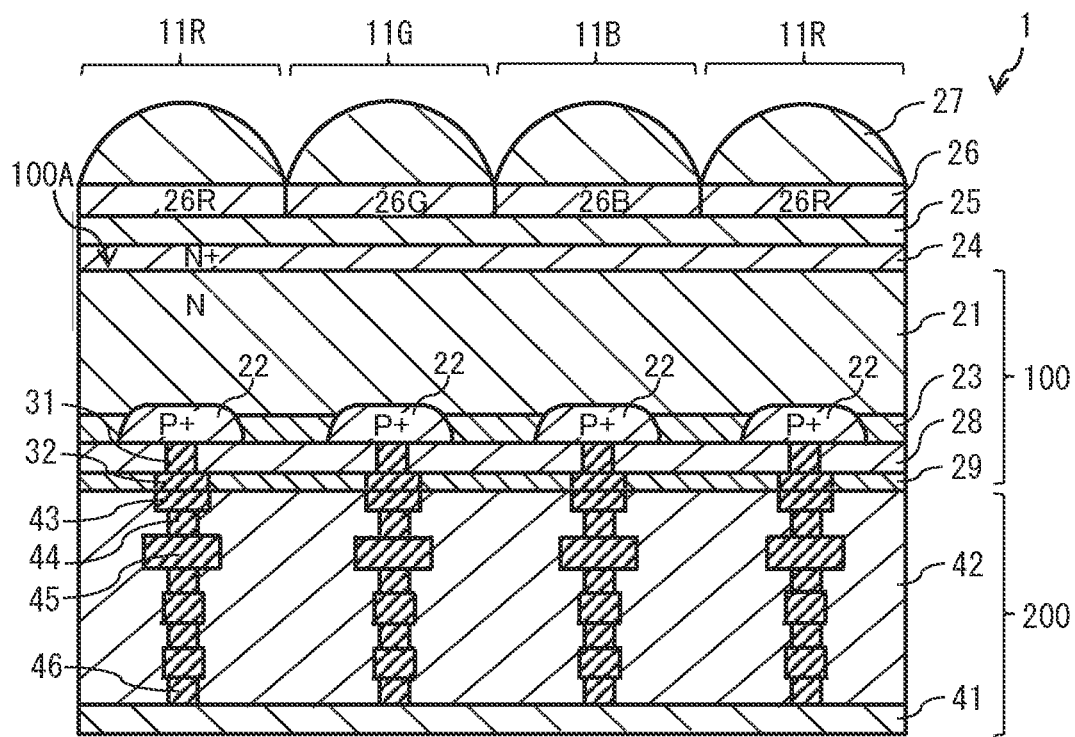
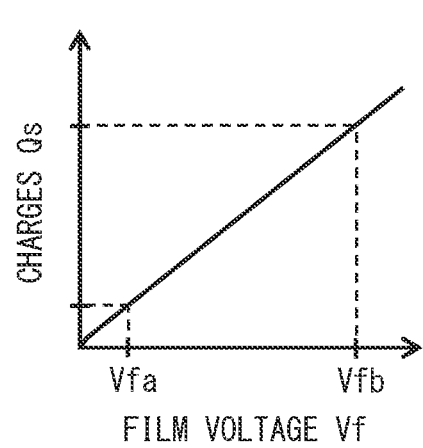
[FIG. 5A]
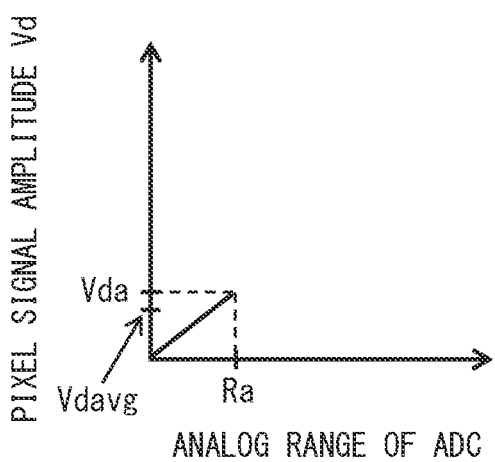
[FIG. 5B]

[FIG. 6]
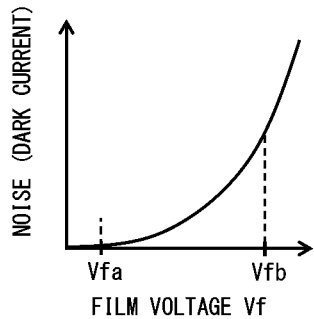
[FIG. 7]
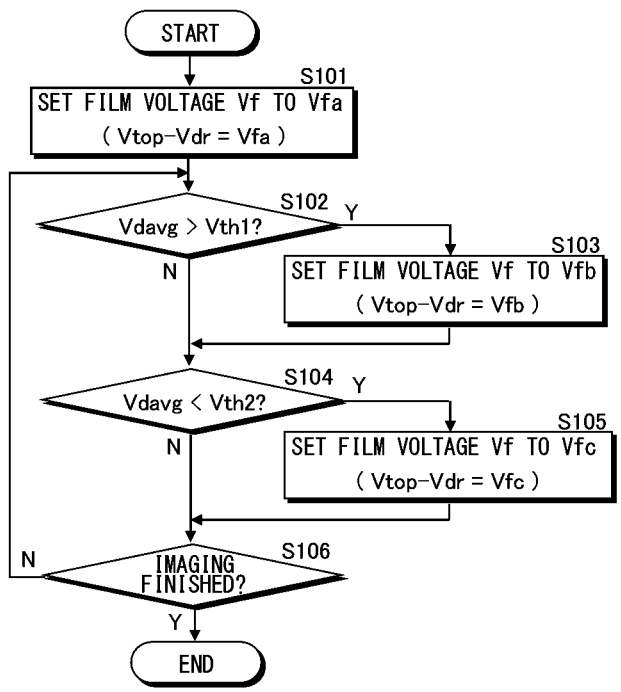

[FIG. 8]
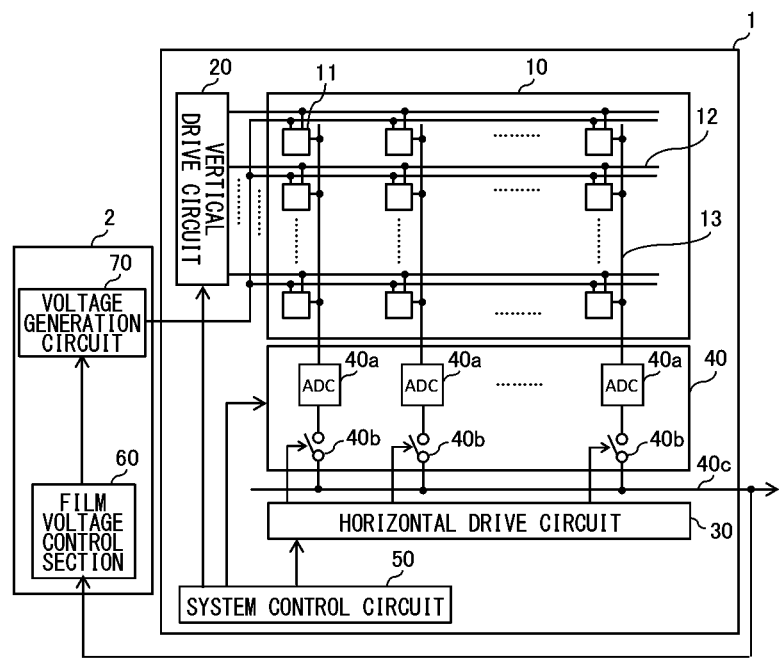

[FIG. 9]
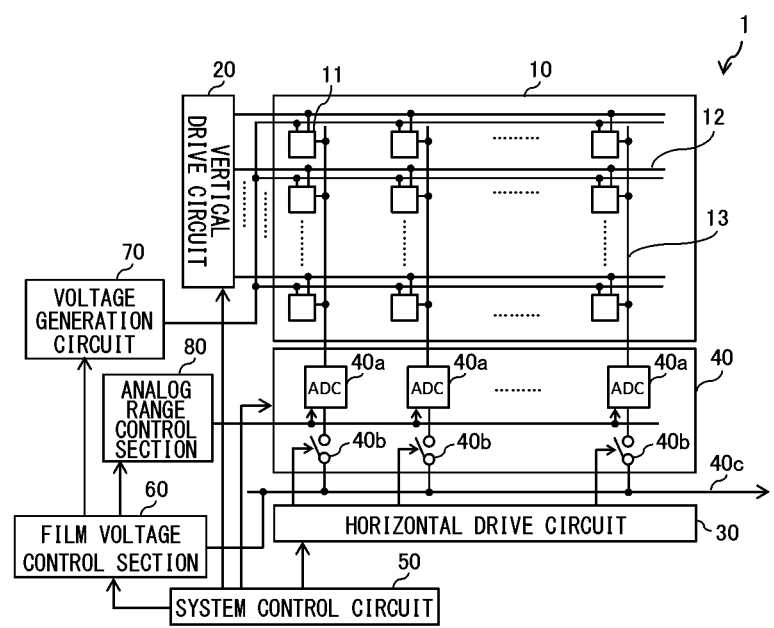

[FIG. 10]
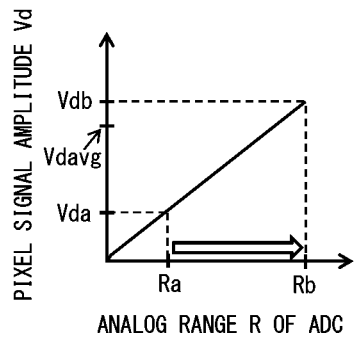
[FIG. 11]
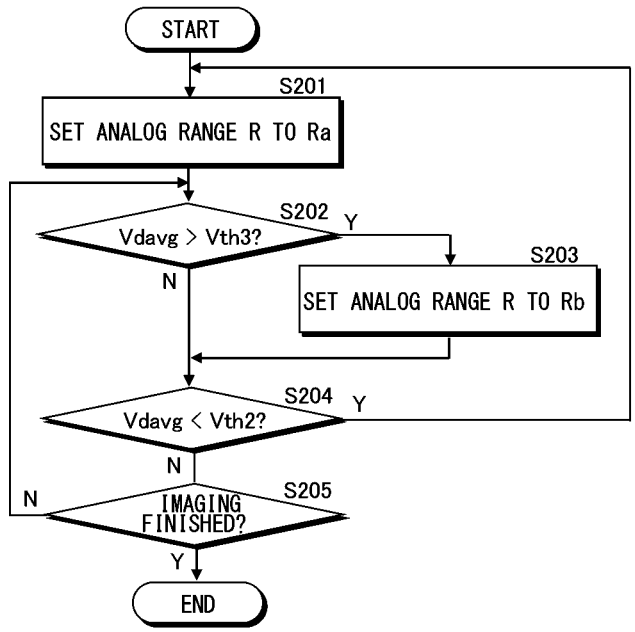

[FIG. 12]
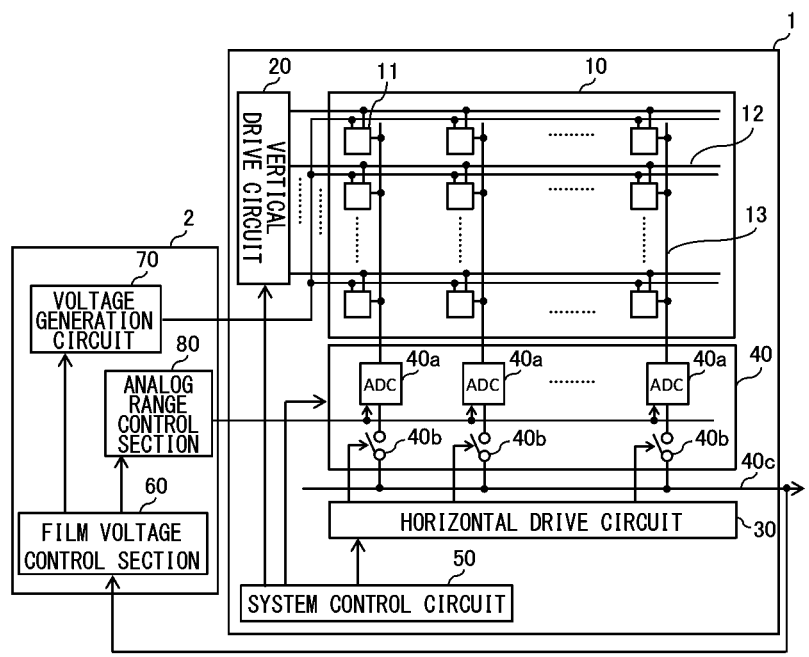

[FIG. 13]
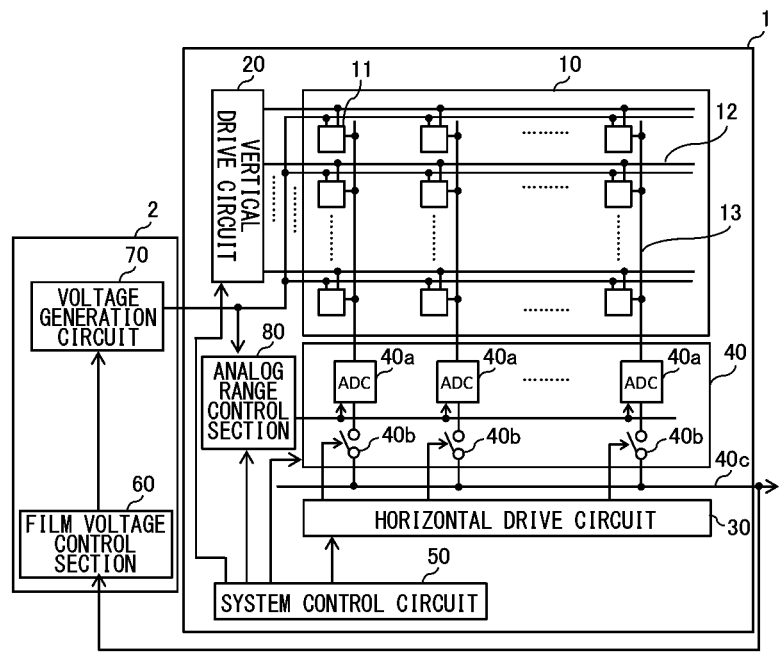

[FIG. 14]
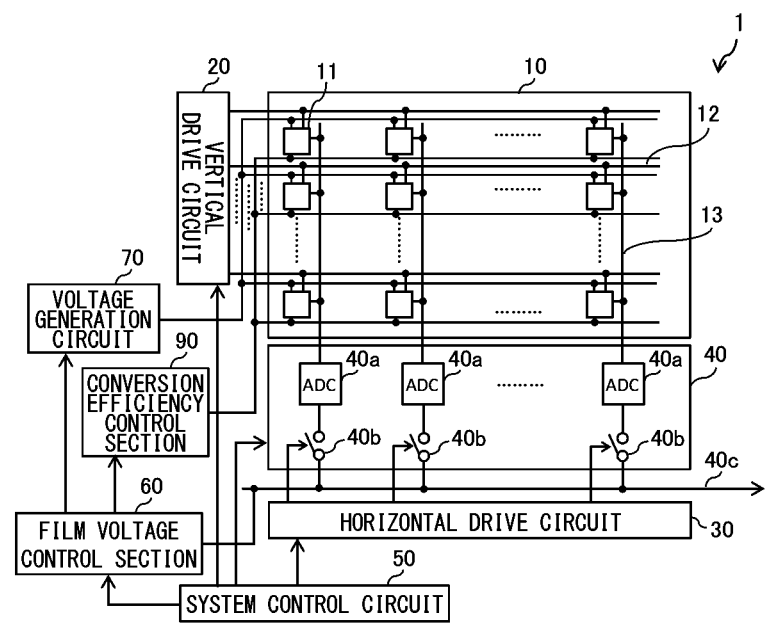

[FIG. 15]
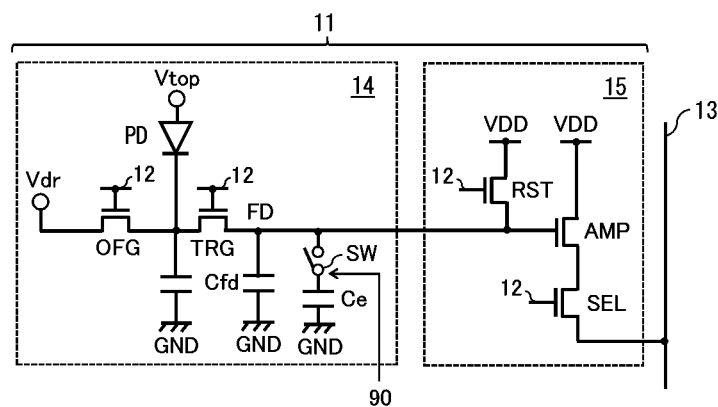
[FIG. 16]
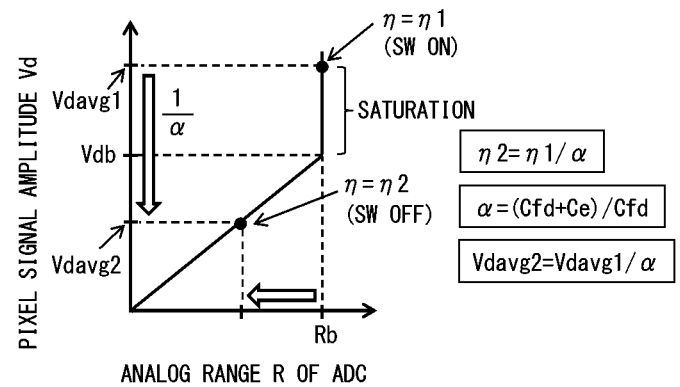

[FIG. 17]
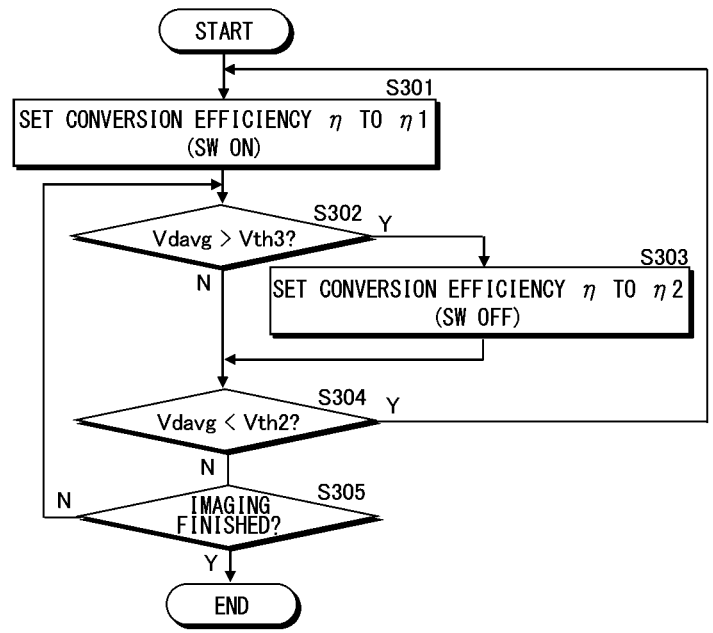

[FIG. 18]
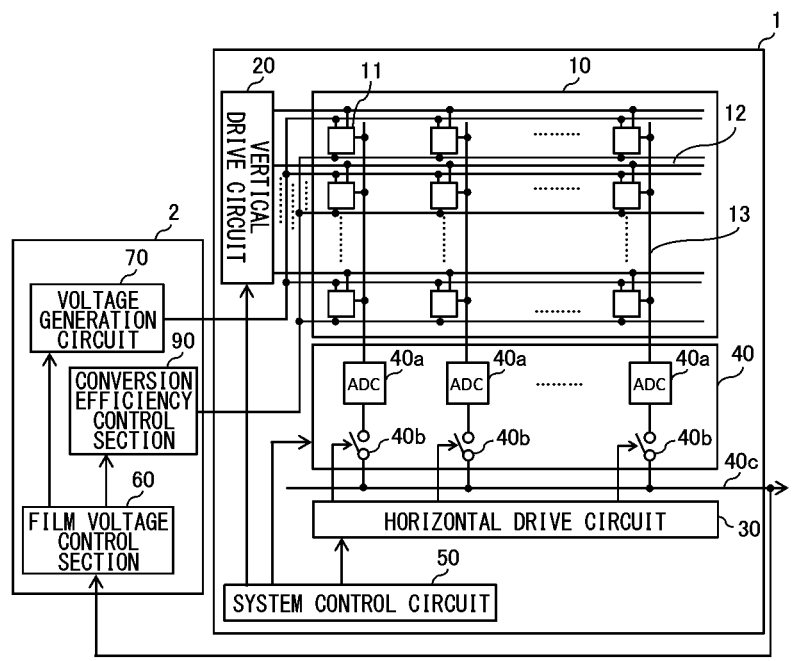

[FIG. 19]
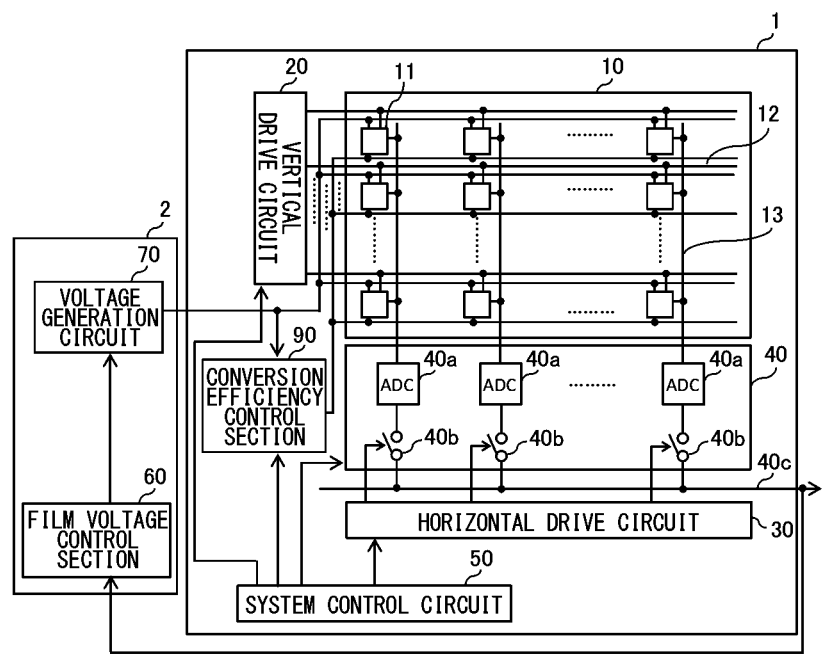

[FIG. 20]
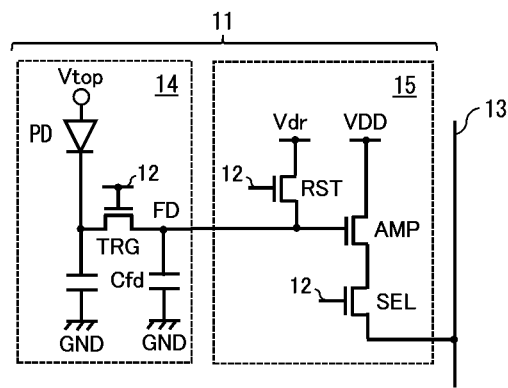
[FIG. 21]
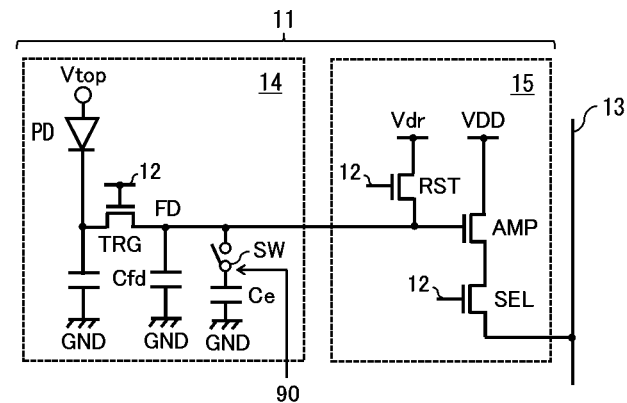

[FIG. 22]
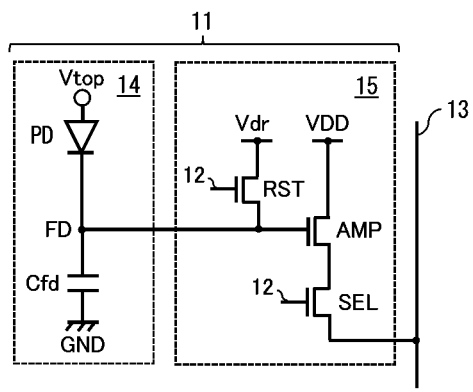
[FIG. 23]
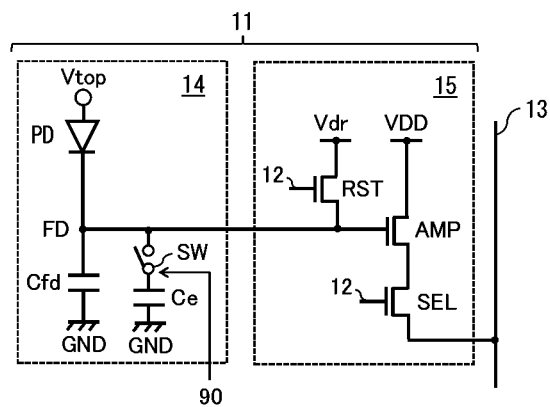

[FIG. 24]
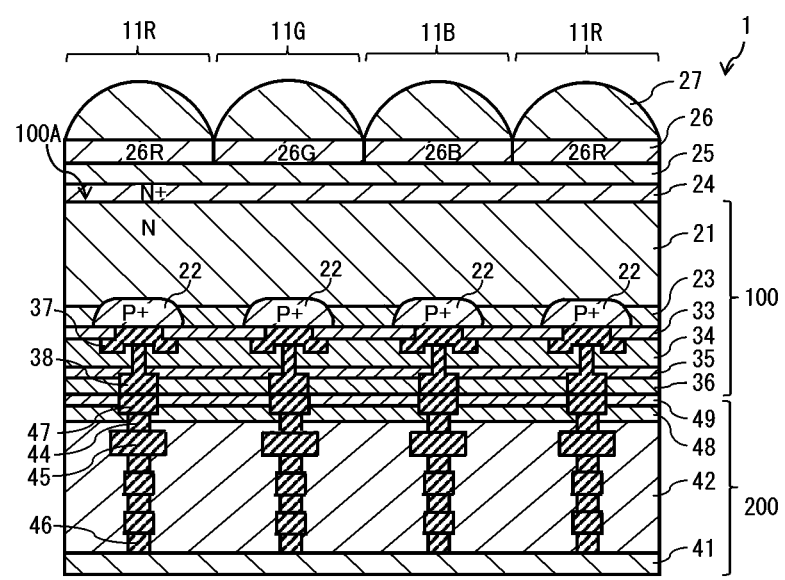

[FIG. 25]
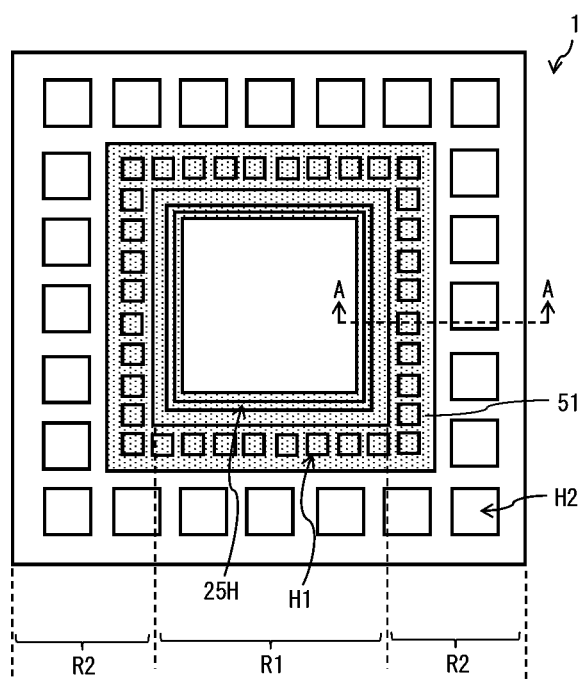

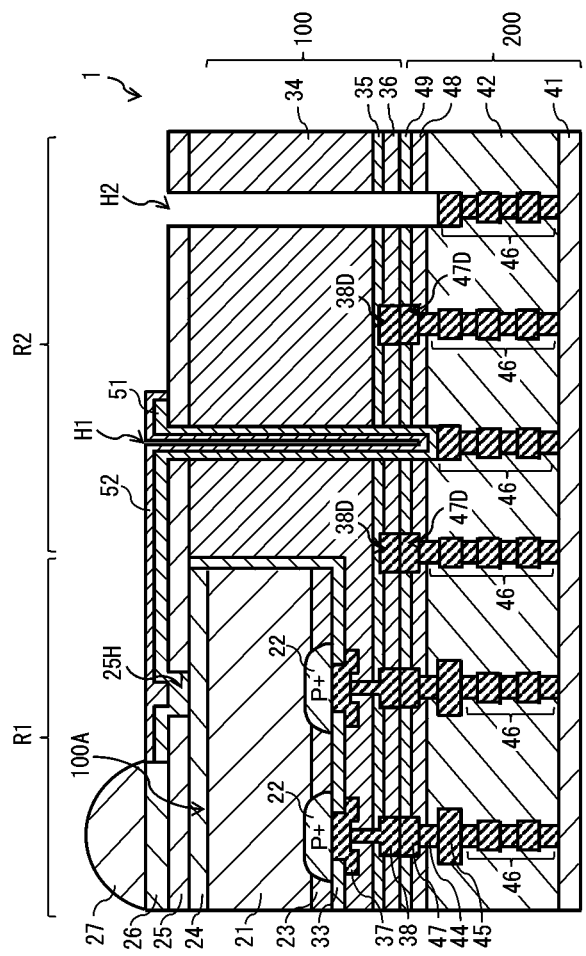
[FIG. 26]

[FIG. 27]
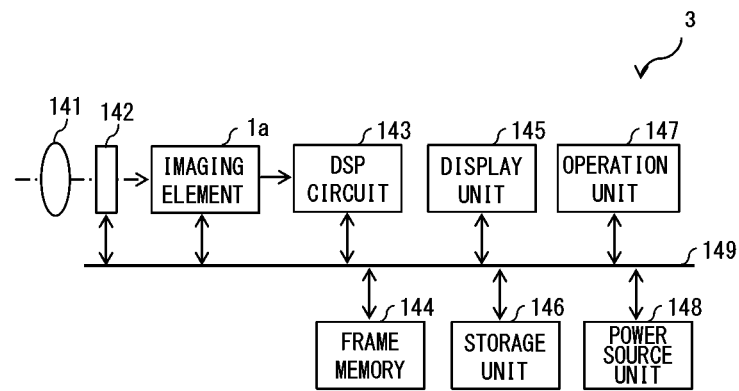
[FIG. 28]
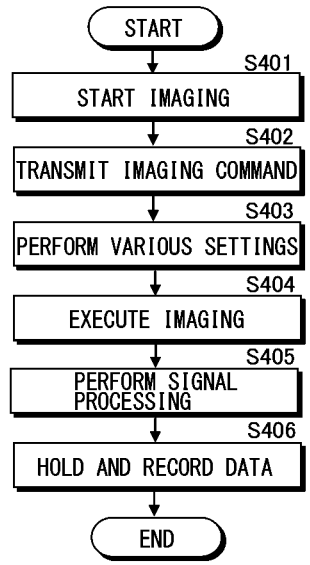

[FIG. 29]
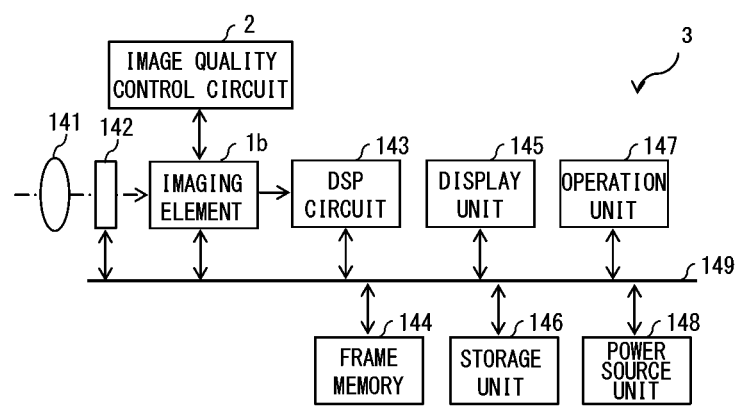

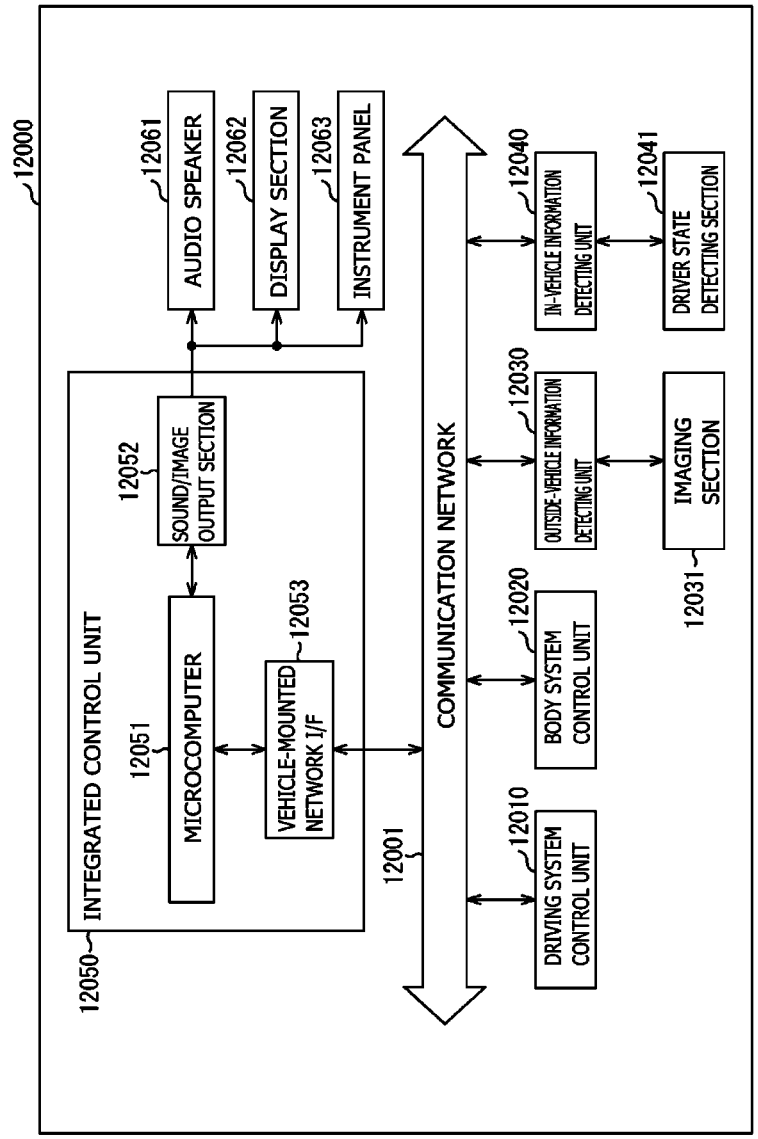

[FIG. 31]
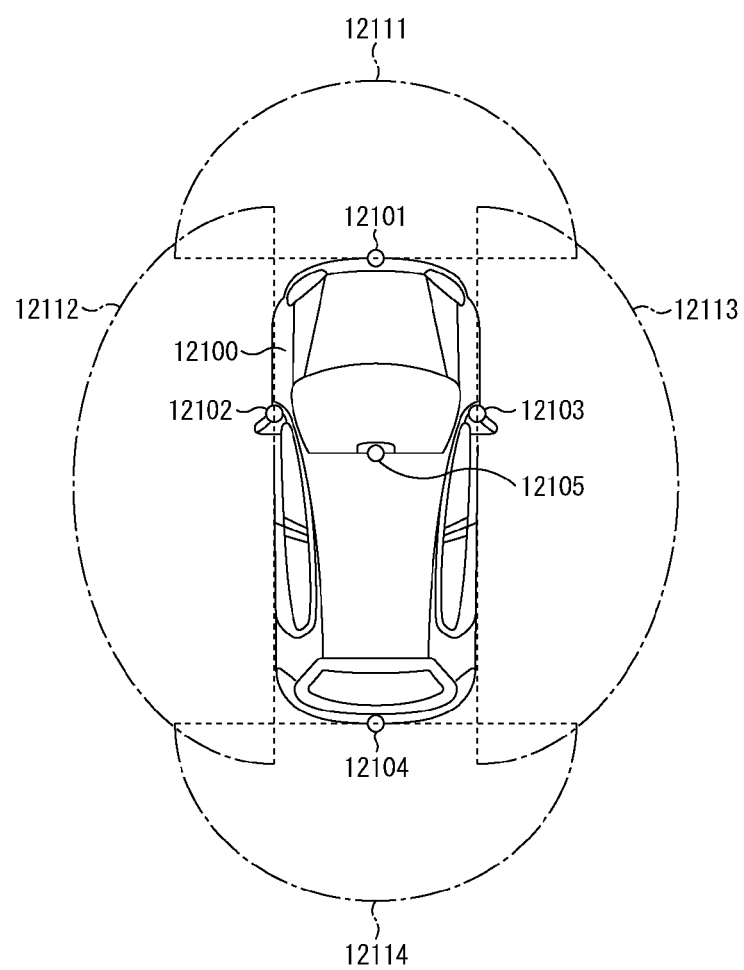

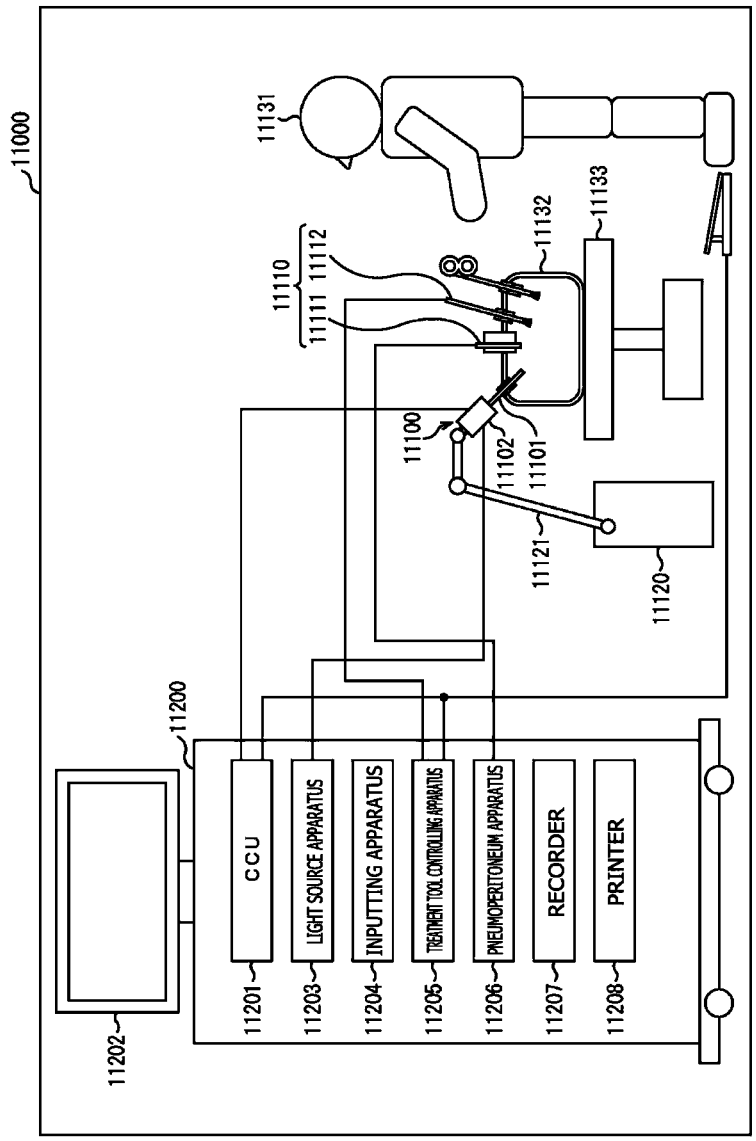
[FIG. 32]

[FIG. 33]
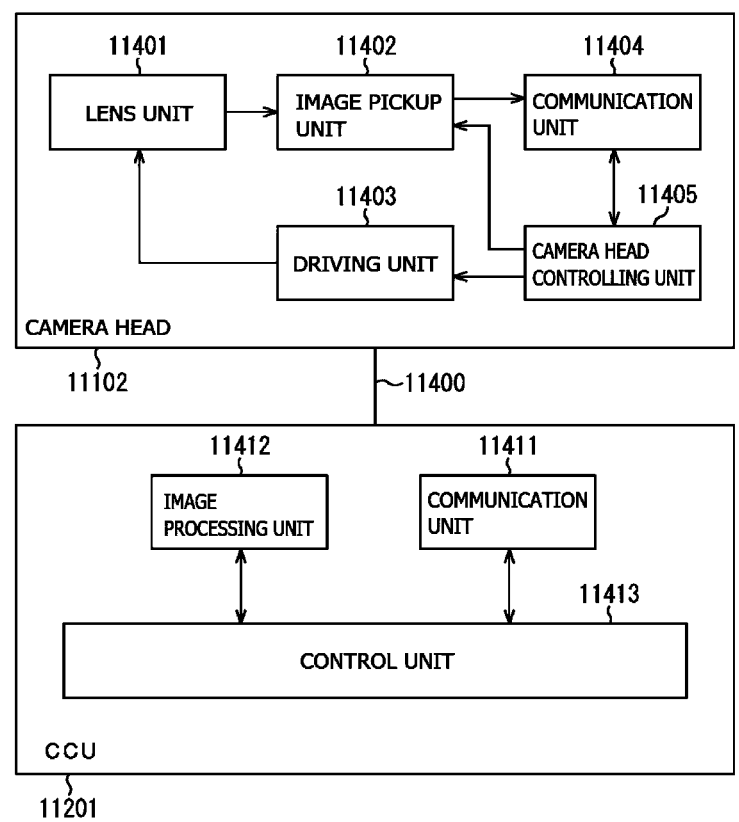

IMAGING ELEMENT AND IMAGING APPARATUS

CROSS REFERENCE TO RELATED APPLICATIONS

This application is a U.S. National Phase of International Patent Application No. PCT/JP2020/007045 filed on Feb. 21, 2020, which claims priority benefit of Japanese Patent Application No. JP 2019-043786 filed in the Japan Patent Office on Mar. 11, 2019. Each of the above-referenced applications is hereby incorporated herein by reference in its entirety.

TECHNICAL FIELD

The present disclosure relates to an imaging element and an imaging apparatus.

BACKGROUND ART

In recent years, an imaging element (an infrared sensor) sensitive to an infrared region has been commercialized. For example, PTL 1 describes use of a group III-V semiconductor such as InGaAs (indium gallium arsenide) as a photoelectric conversion section for such an infrared sensor. In this photoelectric conversion section, infrared rays are absorbed to generate charges.

CITATION LIST

Patent Literature

PTL 1: International Publication No. WO2017/150167

SUMMARY OF THE INVENTION

It is desired for such an imaging element to suppress a decrease in image quality. It is therefore desirable to provide an imaging element and an imaging apparatus that make it possible to suppress a decrease in image quality.

An imaging element according to an embodiment of the present disclosure includes a plurality of sensor pixels and a voltage control section. The sensor pixels each include a photoelectric conversion section, and a readout circuit that outputs a pixel signal based on charges outputted from the photoelectric conversion section. The voltage control section applies a control voltage based on the pixel signal to each photoelectric conversion section.

An imaging apparatus according to an embodiment of the present disclosure includes an imaging element and an image quality control circuit. The imaging element includes a plurality of sensor pixels. The sensor pixels each include a photoelectric conversion section, and a readout circuit that outputs a pixel signal based on charges outputted from the photoelectric conversion section. The image quality control circuit applies a control voltage based on the pixel signal to each photoelectric conversion section.

In the imaging element and the imaging apparatus according to respective embodiments of the present disclosure, the control voltage based on the pixel signal is applied to each photoelectric conversion section. This allows for control of image quality of image data obtained by the imaging element, thus enabling image quality adjustment according to magnitude of luminance of the image data to be performed, as compared with a case where a fixed voltage is applied to each photoelectric conversion section.

BRIEF DESCRIPTION OF THE DRAWINGS

FIG. 1 illustrates a schematic configuration example of an imaging element according to a first embodiment of the present disclosure.

FIG. 2 illustrates a circuit configuration example of a sensor pixel of FIG. 1.

FIG. 3 illustrates a perspective configuration example of the imaging element of FIG. 1.

FIG. 4 illustrates a cross-sectional configuration example of the imaging element of FIG. 3.

FIG. 5A illustrates an example of a relationship between a film voltage of the imaging element of FIG. 1 and charges that are able to be held. FIG. 5B illustrates an example of a relationship between an analog range of an ADC and amplitude of a pixel signal.

FIG. 6 illustrates an example of a relationship between the film voltage of the imaging element of FIG. 1 and a noise.

FIG. 7 illustrates an example of an image quality adjustment procedure of the imaging element of FIG. 1.

FIG. 8 illustrates a modification example of the schematic configuration of the imaging element of FIG. 1.

FIG. 9 illustrates a modification example of the schematic configuration of the imaging element of FIG. 1.

FIG. 10 illustrates an example of a relationship between an analog range of the ADC and amplitude of the pixel signal.

FIG. 11 illustrates an example of an image quality adjustment procedure of the imaging element of FIG. 9.

FIG. 12 illustrates a modification example of the schematic configuration of the imaging element of FIG. 9.

FIG. 13 illustrates a modification example of the schematic configuration of the imaging element of FIG. 9.

FIG. 14 illustrates a modification example of the schematic configuration of the imaging element of FIG. 1.

FIG. 15 illustrates a circuit configuration example of a sensor pixel of FIG. 14.

FIG. 16 illustrates an example of a relationship between an analog range of the ADC and amplitude of the pixel signal.

FIG. 17 illustrates an example of an image quality adjustment procedure of the imaging element of FIG. 14.

FIG. 18 illustrates a modification example of the schematic configuration of the imaging element of FIG. 14.

FIG. 19 illustrates a modification example of the schematic configuration of the imaging element of FIG. 14.

FIG. 20 illustrates a modification example of the circuit configuration of the sensor pixel of FIG. 2.

FIG. 21 illustrates a modification example of the circuit configuration of the sensor pixel of FIG. 15.

FIG. 22 illustrates a modification example of the circuit configuration of the sensor pixel of FIG. 2.

FIG. 23 illustrates a modification example of the circuit configuration of the sensor pixel of FIG. 15.

FIG. 24 illustrates a modification example of the cross-sectional configuration of the imaging element of FIG. 3.

FIG. 25 illustrates an example of a planar configuration of the imaging element of FIG. 1.

FIG. 26 illustrates an example of a cross-sectional configuration of the imaging element of FIG. 25 along a line A-A.

FIG. 27 illustrates a schematic configuration example of an imaging apparatus according to a second embodiment of the present disclosure.

FIG. 28 illustrates an example of an imaging procedure in the imaging apparatus of FIG. 27.

FIG. 29 illustrates a modification example of the schematic configuration of the imaging apparatus of FIG. 27.

FIG. 30 is a block diagram depicting an example of schematic configuration of a vehicle control system.

FIG. 31 is a diagram of assistance in explaining an example of installation positions of an outside-vehicle information detecting section and an imaging section.

FIG. 32 is a view depicting an example of a schematic configuration of an endoscopic surgery system.

FIG. 33 is a block diagram depicting an example of a functional configuration of a camera head and a camera control unit (CCU).

MODES FOR CARRYING OUT THE INVENTION

Hereinafter, description is given in detail, with reference to the drawings, of embodiments for carrying out the present disclosure. It is to be noted that the description is given in the following order.

1. First Embodiment (Imaging Element). FIGS. 1, 2, 3, 4, 5A, 5B, 6, and 7
2. Modification Examples of First Embodiment (Imaging Element) . . . FIGS. 8 to 26
3. Second Embodiment (Imaging Apparatus) . . . FIGS. 27 and 28
4. Modification Example of Second Embodiment (Imaging Apparatus) . . . FIG. 29
5. Practical Application Examples
Practical Application Example 1 (Mobile Body). FIGS. 30 and 31
Practical Application Example 2 (Surgery System). FIGS. 32 and 33

1. First Embodiment

[Configuration]

Description is given of an imaging element 1 according to a first embodiment of the present disclosure. FIG. 1 illustrates a schematic configuration example of the imaging element 1. The imaging element 1 is, for example, an infrared image sensor, and is also sensitive to light of a wavelength of 800 nm or more, for example. The imaging element 1 includes a pixel array section 10 in which a plurality of sensor pixels 11 each including a photoelectric conversion element are two-dimensionally arranged in matrix (matrix shape). As illustrated in FIG. 2, for example, the sensor pixel 11 is configured by a pixel circuit 14 that performs photoelectric conversion and a readout circuit 15 that outputs a pixel signal based on charges outputted from the pixel circuit 14.

The pixel circuit 14 includes, for example, a photodiode PD, a transfer transistor TRG, a floating diffusion FD, and a discharge transistor OFG. The transfer transistor TRG and the discharge transistor OFG are each, for example, an NMOS (Metal Oxide Semiconductor) transistor. The photodiode PD corresponds to a specific example of a "photoelectric conversion section" of the present disclosure.

The photodiode PD is the photoelectric conversion section that absorbs light of a predetermined wavelength (e.g., light of a wavelength of an infrared region, i.e., a wavelength of 900 nm to 1700 nm), and generates signal charges. The photodiode PD includes, for example, a compound semiconductor such as a group III-V semiconductor. Examples of the group III-V semiconductor to be used for the photodiode PD include InGaP, InAlP, InGaAs, InAlAs, or a compound semiconductor of a chalcopyrite structure. The compound semiconductor of the chalcopyrite structure is a material that allows for a high light absorption coefficient and high sensitivity over a wide wavelength region, and is preferably used as an n-type semiconductor material for photoelectric conversion. The photodiode PD may include, in addition to the above-mentioned compound semiconductors, amorphous silicon (Si), germanium (Ge), a quantum dot photoelectric conversion film, an organic photoelectric conversion film, or the like.

A cathode of the photodiode PD is coupled to a source of the transfer transistor TRG, and an anode of the photodiode PD is coupled to a power source line to which a voltage Vtop is applied. A drain of the transfer transistor TRG is coupled to the floating diffusion FD, and a gate of the transfer transistor TRG is coupled to a pixel drive line 12.

The transfer transistor TRG is coupled between the cathode of the photodiode PD and the floating diffusion FD, and transfers charges held in the photodiode PD to the floating diffusion FD in response to a control signal applied to a gate electrode. The drain of the transfer transistor TRG is electrically coupled to the floating diffusion FD, and the gate of the transfer transistor TRG is coupled to the pixel drive line 12.

The floating diffusion FD is a floating diffusion region that temporarily holds charges transferred from the photodiode PD via the transfer transistor TRG. For example, the readout circuit 15 is coupled to the floating diffusion FD, and, in addition, a vertical signal line 13 is coupled thereto via the readout circuit 15. The floating diffusion FD is coupled to an input end of the readout circuit 15.

A drain of the discharge transistor OFG is coupled to the power source line to which a voltage Vdr is applied, and a source thereof is coupled to the cathode of the photodiode PD. The discharge transistor OFG initializes (resets) charges of the photodiode PD in response to a control signal applied to the gate electrode.

The readout circuit 15 includes, for example, a reset transistor RST, a selection transistor SEL, and an amplification transistor AMP. A source of the reset transistor RST (input end of the readout circuit 15) is coupled to the floating diffusion FD, and a drain of the reset transistor RST is coupled to a power source line VDD and a drain of the amplification transistor AMP. A gate of the reset transistor RST is coupled to the pixel drive line 12. A source of the amplification transistor AMP is coupled to a drain of the selection transistor SEL, and a gate of the amplification transistor AMP is coupled to the source of the reset transistor RST. A source of the selection transistor SEL (an output end of the readout circuit 15) is coupled to the vertical signal line 13, and a gate of the selection transistor SEL is coupled to the pixel drive line 12.

The reset transistor RST initializes (resets) an electric potential of the floating diffusion FD to a predetermined electric potential. When the reset transistor RST is brought into an ON state, the electric potential of the floating diffusion FD is reset to an electric potential of the power source line VDD. The selection transistor SEL controls an output timing of a pixel signal from the readout circuit 15. The amplification transistor AMP generates, as a pixel signal, a signal of a voltage corresponding to a level of charges held in the floating diffusion FD. That is, the amplification transistor AMP generates, as a pixel signal, a signal of a voltage corresponding to an amount of light reception in the sensor pixel 11. The amplification transistor AMP configures a source-follower type amplifier, and output a pixel signal of a voltage corresponding to a level of charges generated in the photodiode PD. When the selection transistor SEL is brought into an ON state, the amplification transistor AMP amplifies an electric potential of the floating diffusion FD, and outputs a voltage corresponding to the electric potential to a horizontal selection circuit 40 described later via the vertical signal line 13.

It is to be noted that the selection transistor SEL may be provided between the power source line VDD and the amplification transistor AMP. In this case, the drain of the reset transistor RST is coupled to the power source line VDD and the drain of the selection transistor SEL. The source of the selection transistor SEL is coupled to the drain of the amplification transistor AMP, and the gate of the selection transistor SEL is coupled to the pixel drive line 12. The source of the amplification transistor AMP (output end of the readout circuit 15) is coupled to the vertical signal line 13, and the gate of the amplification transistor AMP is coupled to the source of the reset transistor RST.

The imaging element 1 includes, for example, two substrates (a light-receiving substrate 100 and a drive substrate 200) as illustrated in FIG. 3. The imaging element 1 has a three-dimensional structure configured by attaching the two substrates (light-receiving substrate 100 and drive substrate 200) together.

The light-receiving substrate 100 is a substrate including a plurality of photodiodes PD being formed in matrix on a silicon (Si) substrate. A top surface of the light-receiving substrate 100 (a front surface on side opposite to the drive substrate 200) is a light-receiving surface 100A. The drive substrate 200 is a substrate including a pixel signal generation circuit region 200A and a peripheral circuit region 200B being formed on the Si substrate. A plurality of pixel signal generation circuits 45 are formed in matrix in the pixel signal generation circuit region 200A. Each pixel signal generation circuit 45 is a circuit excluding the photodiode PD of the sensor pixel 11. A logic circuit that processes a pixel signal is formed in the peripheral circuit region 200B; for example, a vertical drive circuit 20, a horizontal drive circuit 30, the horizontal selection circuit 40, a system control circuit 50, a film voltage control section 60, and a voltage generation circuit 70 are formed. That is, the imaging element 1 includes the pixel array section 10, the vertical drive circuit 20, the horizontal drive circuit 30, the horizontal selection circuit 40, the system control circuit 50, the film voltage control section 60, and the voltage generation circuit 70. The logic circuit outputs a pixel signal (digital value) of each sensor pixel 11 to the outside.

The system control circuit 50 generates, on the basis of a master clock, a clock signal, a control signal, or the like that serves as criteria for operations of the vertical drive circuit 20, the horizontal drive circuit 30, the horizontal selection circuit 40, the film voltage control section 60, and the like, and provides the clock signal, the control signal, or the like to the vertical drive circuit 20, the horizontal selection circuit 40, and the film voltage control section 60.

The vertical drive circuit 20 is configured by, for example, a shift register, or the like, and controls row scanning of the plurality of sensor pixels 11 via the plurality of pixel drive lines 12. The horizontal selection circuit 40 is, for example, a circuit provided with an ADC 40a and a switch element 40b for each pixel column (or vertical signal line 13) of the pixel array section 10. The ADC 40a performs AD (Analog-to-Digital) conversion of the pixel signal. The ADC 40a enables an analog range R to be varied, and sets an analog range R based on a range set value inputted from the outside. It is to be noted that, in the present embodiment, the analog range R is set to Ra.

The vertical signal line 13 is coupled to an input end of the ADC 40a, and the switch element 40b is coupled to an output end of the ADC 40a. The horizontal drive circuit 30 is configured by, for example, a shift register, or the like, and sequentially drives each switch element 40b of the horizontal selection circuit 40. The sequential driving of each switch element 40b by the horizontal drive circuit 30 causes each pixel signal transmitted through each vertical signal line 13 to be sequentially outputted to a horizontal signal line 40c and to be inputted to a DSP circuit, or the like.

The film voltage control section 60 controls a film voltage Vf to be applied to each photodiode PD on the basis of a pixel signal obtained from the sensor pixel 11. The film voltage control section 60 outputs a control signal for controlling of the film voltage Vf to the voltage generation circuit 70. On the basis of the control signal inputted from the film voltage control section 60, the voltage generation circuit 70 generates analog voltages (voltages Vtop and Vdr), and applies the generated voltages to each photodiode PD via the power source line. That is, the film voltage control section 60 and the voltage generation circuit 70 apply the film voltage Vf based on the pixel signal obtained from the sensor pixel 11 to each photodiode PD to thereby control image quality of image data obtained from the pixel signal.

FIG. 4 illustrates a cross-sectional configuration example of the imaging element 1. In the imaging element 1, the light-receiving substrate 100 includes an n-type semiconductor film 21 that is a photoelectric conversion section (photodiode PD). The n-type semiconductor film 21 is formed on the entire surface of the pixel array section 10, and is configured by, for example, the material described above as the material to be used for the photodiode PD. It is to be noted that, in the following, description is given of other configurations, supposing that the n-type semiconductor film 21 is configured by InGaAs.

The light-receiving substrate 100 further includes, for each of the sensor pixels 11, a p-type semiconductor layer 22 in contact with a surface, of the n-type semiconductor film 21, on side of the drive substrate 200. Each p-type semiconductor layer 22 is formed by a p-type semiconductor with a high concentration, and is formed by p-type InGaAs, for example. The p-type semiconductor layer 22 has a function as an electrode (second electrode) of the photodiode PD. A predetermined voltage Vdr is applied to the p-type semiconductor layer 22 via the discharge transistor OFG in an ON state, or the voltage Vdd of the power source line VDD is applied thereto via the transfer transistor TRG and the reset transistor RST in ON states. The light-receiving substrate 100 further includes an n-type semiconductor layer 23 that separates the p-type semiconductor layers 22 from each other. The n-type semiconductor layer 23 is formed in the same layer as each of the p-type semiconductor layers 22, and is formed by n-type InP, for example.

The light-receiving substrate 100 further includes an n-type semiconductor layer 24 in contact with a surface, of the n-type semiconductor film 21, on side of the light-receiving surface 100A. The n-type semiconductor layer 24 is formed by an n-type semiconductor with a concentration higher than that of the n-type semiconductor film 21, and is formed by, for example, n-type InGaAs, n-type InP, or n-type InAlAs. The n-type semiconductor layer 24 functions as a barrier layer that prevents backflow of charges generated in the n-type semiconductor film 21. The light-receiving substrate 100 further includes an antireflection film 25 in contact with a surface, of the n-type semiconductor layer 24, on side of the light-receiving surface 100A. The antireflection film 25 is formed by, for example, silicon nitride (SiN), hafnium oxide (HfO$_2$), aluminum oxide (Al$_2$O$_3$), zirconium oxide (ZrO$_2$), tantalum oxide (Ta$_2$Ta$_5$), titanium oxide (TiO$_2$), and the like. The n-type semiconductor layer 24 also functions as an electrode (first electrode) on upper side, of electrodes that vertically sandwich the n-type semiconductor film 21. The predetermined voltage Vtop is applied to the upper electrode.

The light-receiving substrate 100 further includes a color filter 26 and an on-chip lens 27 on top of the antireflection film 25. The color filter 26 is configured by a plurality of filters 26R that selectively transmits red light, a plurality of filters 26G that selectively transmits green light, and a plurality of filters 26G that selectively transmits blue light. The plurality of filters 26R, 26G, and 26B are each provided one by one for the respective sensor pixels 11, and are arranged in a Bayer arrangement in a plane parallel to the light-receiving surface 100A, for example. It is to be noted that, in FIG. 4, the sensor pixel 11 provided with the filter 26R is denoted as 11R; the sensor pixel 11 provided with the filter 26G is denoted as 11G; and the sensor pixel 11 provided with the filter 26B is denoted as 11B. It is to be noted that the color filter 26 may be omitted as necessary.

The light-receiving substrate 100 further includes a passivation layer 28 and an insulating layer 29 on lower side of the p-type semiconductor layer 22 and the n-type semiconductor layer 23. The light-receiving substrate 100 further includes a coupling electrode 31 that penetrates the passivation layer 28 and is in contact with the p-type semiconductor layer 22, and a bump electrode 32 that penetrates the insulating layer 29 and is in contact with the coupling electrode 31. Sets of the coupling electrode 31 and the bump electrode 32 are provided one by one for the respective sensor pixels 11. The bump electrode 32 is bonded to a coupling layer 43 (described later) of the drive substrate 200, and is electrically coupled to the coupling layer 43. For example, the bump electrode 32 is bonded to the coupling layer 43 of the drive substrate 200 when the light-receiving substrate 100 and the drive substrate 200 are attached to each other.

The drive substrate 200 includes a support substrate 41 and an interlayer insulating layer 42. The support substrate 41 is configured by a silicon (Si) substrate, for example. The interlayer insulating layer 42 is provided between the support substrate 41 and the insulating layer 291 (light-receiving substrate 100). For example, the interlayer insulating layer 42 includes, in order from a position close to the light-receiving substrate 100, the plurality of coupling layers 43, a plurality of readout electrodes 44, the plurality of pixel signal generation circuits 45, and a plurality of wiring lines 46. A plurality of sets of the coupling layers 43, the readout electrodes 44, the pixel signal generation circuits 45, and the wiring lines 46 are provided one by one for the respective sensor pixels 11. A plurality of interlayer insulating layers 42 inside the interlayer insulating layer 42 is provided inside an ROIC (Read Out IC) for reading charges from each photodiode PD, for example. The drive substrate 200 is provided with the logic circuit described above at a location, of the interlayer insulating layer 42, corresponding to the peripheral circuit region 200B.

FIG. 5A illustrates an example of a relationship between the film voltage Vf to be applied to the photodiode PD and charges Qs that are able to be held in the photodiode PD. FIG. 5B illustrates an example of a relationship between an analog range (dynamic range) of the ADC 40a and amplitude Vd of a pixel signal. FIG. 5B exemplifies a case where the analog range of the ADC 40a is set to Ra.

It is appreciated, from FIG. 5A, that as the voltage (film voltage Vf=Vtop−Vdr) to be applied to the photodiode PD (n-type semiconductor film 21) is increased, an amount of charges Qs that are able to be held in the photodiode PD (n-type semiconductor film 21) is also increased. As the amount of the charges Qs held in the photodiode PD (n-type semiconductor film 21) is increased, the amplitude Vd of the pixel signal is also increased. However, as illustrated in FIG. 5B, it is essential that an average value Vdavg (described later) of the amplitude Vd of the pixel signal does not exceed a voltage Vda corresponding to the analog range Ra of the ADC 40a. In a case where the average value Vdavg of the amplitude Vd of the pixel signal exceeds the voltage Vda corresponding to the analog range Ra of the ADC 40a, the ADC 40a is saturated, and an output of the ADC 40a becomes a constant value.

FIG. 6 illustrates an example of a relationship between the film voltage Vf to be applied to the photodiode PD and a noise (dark current) generated in the photodiode PD. It is appreciated, from FIG. 6, that as the voltage (film voltage Vf=Vtop−Vdr) to be applied to the photodiode PD (n-type semiconductor film 21) is increased, a level of a noise (dark current) generated in the photodiode PD is increased exponentially. Accordingly, at high luminance, an optical shot noise is dominant, and thus the film voltage Vf is set higher, whereas, at low luminance, the noise (dark current) is dominant, and thus the film voltage Vf is set lower, thereby enabling suppression of deterioration in image quality.

[Image Quality Adjustment]

Next, description is given, with reference to FIG. 7, of an image quality adjustment procedure of the imaging element 1. FIG. 7 illustrates an example of the image quality adjustment procedure of the imaging element 1. Upon receiving an imaging command, the system control circuit 50 outputs a film voltage setting command to the film voltage control section 60. Upon receiving the film voltage setting command, the film voltage control section 60 first sets the film voltage Vf to Vfa (step S101). Specifically, the film voltage control section 60 sets Vtop (first voltage) and Vdr (second voltage) to allow an electric potential difference (Vtop−Vdr) between Vtop and Vdr to be Vfa. For example, the film voltage control section 60 sets Vtop to +2V and Vdr to +1V. The film voltage control section 60 outputs set values of Vtop and Vdr to the voltage generation circuit 70. On the basis of the set values inputted from the film voltage control section 60, the voltage generation circuit 70 applies the voltage of Vtop=+2V to a power source line coupled to the anode of the photodiode PD, and applies the voltage of Vdr=+1V to a power source line coupled to the drain of the discharge transistor OFG.

Next, the film voltage control section 60 determines whether or not the average value Vdavg of the plurality of pixel signals obtained from the plurality of sensor pixels 11 of a target region of the pixel array section 10 exceeds a predetermined threshold value Vth1 (first threshold value) (step S102). The threshold value Vth1 is a threshold value used to judge whether or not the optical shot noise is dominant when the film voltage Vf is set to Vfa. As a result, in a case where the average value Vdavg exceeds the predetermined threshold value Vth1, the film voltage control section 60 sets the film voltage Vf to Vfb (Vfb>Vfa) (step S103). That is, the film voltage control section 60 causes the film voltage Vf to be relatively larger than Vfa. Specifically, the film voltage control section 60 sets, on the basis of the average value Vdavg, Vtop and Vdr to allow Vtop−Vdr to be Vfb. For example, the film voltage control section 60 sets Vtop to +3V and Vdr to +1V. The film voltage control section 60 outputs the set values of Vtop and Vdr to the voltage generation circuit 70. On the basis of the set values inputted from the film voltage control section 60, the voltage generation circuit 70 applies the voltage of Vtop=+3V to the power source line coupled to the anode of the photodiode PD, and applies the voltage of Vdr=+1V to the power source line coupled to the drain of the discharge transistor OFG.

In a case where the average value Vdavg is equal to or less than the predetermined threshold value Vth1 and in a case where the film voltage Vf is set to Vfb (Vfb>Vfa), the film voltage control section 60 determines whether or not the average value Vdavg falls below a predetermined threshold value Vth2 (second threshold value) (Vth2<Vth1) (step S104). The threshold value Vth2 is a threshold used to judge whether or not the pixel signal is buried in the noise. As a result, in a case where the average value Vdavg falls below the predetermined threshold value Vth2, the film voltage control section 60 sets the film voltage Vf to Vfc (Vfc<Vfa) (step S105). That is, the film voltage control section 60 causes the film voltage Vf to be relatively smaller than Vfa. Specifically, the film voltage control section 60 sets, on the basis of the average value Vdavg, Vtop and Vdr to allow Vtop−Vdr to be Vfc. Meanwhile, in a case where the average value Vdavg is equal to or more than the predetermined threshold value Vth2, the film voltage control section 60 leaves the set values of the voltage as they are. In a case of receiving a command to finish the imaging, the system control circuit 50 finishes the imaging, and also finishes the image quality adjustment of the imaging element 1 (step S106). In a case of not receiving the command to finish the imaging, the system control circuit 50 instructs the film voltage control section 60 to perform the execution from step S102 again. In this manner, the image quality adjustment of the imaging element 1 is performed.

[Effects]

In the present embodiment, the application of the film voltage Vf based on the output of the imaging element 1 (average value Vdavg of the amplitude Vd of the pixel signal) to each photodiode PD (n-type semiconductor film 21) allows for control of the image quality of image data obtained from the pixel signal. Specifically, when the output of the imaging element 1 (average value Vdavg of the amplitude Vd of the pixel signal) exceeds the threshold value Vth1, the film voltage Vf is set relatively large, whereas, when the output of the imaging element 1 (average value Vdavg of the amplitude Vd of the pixel signal) falls below the threshold value Vth2, the film voltage Vf is set relatively small. In this manner, in the present embodiment, at high luminance, the film voltage Vf is set relatively large to reduce an influence of the optical shot noise, whereas, at low luminance, the film voltage Vf is set relatively small to increase an S/N ratio. This makes it possible to suppress deterioration in image quality.

In addition, in the present embodiment, the voltage Vtop and the voltage Vdr are generated on the basis of the pixel signal to allow the electric potential difference (Vtop−Vdr) between the voltage Vtop and the voltage Vdr to be the film voltage Vf. The film voltage Vf thus generated is applied to each photodiode PD (n-type semiconductor film 21), thereby making it possible to suppress deterioration in image quality.

In addition, in the present embodiment, each pixel circuit 14 includes the photodiode PD (n-type semiconductor film 21), the transfer transistor TRG, and the discharge transistor OFG. When the discharge transistor is turned ON, Vdr is applied to the p-type semiconductor layer 22. This allows the film voltage Vf to be applied to each photodiode PD (n-type semiconductor film 21) on the basis of the pixel signal. Thus, it is possible to suppress deterioration in image quality.

2. Modification Examples of First Embodiment

Modification Example A

In the foregoing embodiment, the film voltage control section 60 and the voltage generation circuit 70 are provided inside the imaging element 1, but may be provided inside an image quality control circuit 2, which is separated from the imaging element 1, for example, as illustrated in FIG. 8. In this case, the film voltage control section 60 may set the film voltage Vf on the basis of the output of the imaging element 1, for example, as illustrated in FIG. 8. Also in such a case, effects similar to those of the foregoing embodiment are achieved.

Modification Example B

In the foregoing embodiment, the imaging element 1 may further include an analog range control section 80, for example, as illustrated in FIG. 9. The analog range control section 80 controls the analog range R of the ADC 40a on the basis of a determination result (i.e., an output of the imaging element 1 (average value Vdavg of the amplitude Vd of the pixel signal)) inputted from the film voltage control section 60. Specifically, the analog range control section 80 outputs a range set value based on the determination result (i.e., output of the imaging element 1 (average value Vdavg of the amplitude Vd of the pixel signal)) inputted from the film voltage control section 60 to the ADC 40a to thereby control image quality of the image data obtained from the pixel signal.

FIG. 10 is an example of a relationship between the analog range R (dynamic range) of the ADC 40a and the amplitude Vd of the pixel signal. FIG. 10 exemplifies a case where the analog range R of the ADC 40a is set to Ra or Rb.

As illustrated in FIG. 10, in a case where the average value Vdavg of the amplitude Vd of the pixel signal exceeds the voltage Vda corresponding to the analog range Ra of the ADC 40a, the ADC 40a is saturated. However, by expanding the analog range R of the ADC 40a from Ra to Rb, the average value Vdavg of the amplitude Vd of the pixel signal falls below a voltage Vdb corresponding to the analog range Rb of the ADC 40a, and the saturation of the ADC 40a is eliminated. Accordingly, at high luminance, the dynamic range R of the ADC 40a is set higher in order to prevent an overexposed highlight, whereas, at low luminance, a noise (dark current) is dominant, and thus setting the dynamic range R of the ADC 40a lower enables suppression of deterioration in image quality.

[Image Quality Adjustment]

Next, description is given, with reference to FIG. 11, of an image quality adjustment procedure of the imaging element 1 according to the present modification example. FIG. 11 illustrates an example of the image quality adjustment procedure of the imaging element 1 according to the present modification example. It is to be noted that, in the present modification example, the imaging element 1 executes the image quality adjustment procedure illustrated in FIG. 7, and executes the image quality adjustment procedure illustrated in FIG. 11.

The analog range control section 80 first sets the analog range R of the ADC 40a to Ra (step S201). Specifically, the analog range control section 80 outputs, to the ADC 40a, a control signal to set the analog range R to Ra. When the control signal to set the analog range R to Ra is inputted from the analog range control section 80, the ADC 40a sets the analog range R to Ra.

Next, in a case where the determination result inputted from the film voltage control section 60 is "Vdavg>Vth3", the analog range control section 80 sets the analog range R to Rb (Rb>Ra) (steps S202 and 203). That is, the analog range control section 80 causes the analog range R to be relatively larger than Ra. The threshold value Vth3 (first threshold value) is a threshold value used to judge whether or not an image has an overexposed highlight when the film voltage Vf is set to Vfa. At this time, the analog range control section 80 outputs, to the ADC 40a, a control signal to set the analog range R to Rb. When the control signal to set the analog range R to Rb is inputted from the analog range control section 80, the ADC 40a sets the analog range R to Rb.

In a case where the determination result inputted from the film voltage control section 60 is "Vdavg≤Vth3" or in a case where the analog range R is set to Rb, the analog range control section 80 waits for a determination result of a magnitude relationship between the average value Vdavg and the threshold value Vth2 to be inputted from the film voltage control section 60. At this time, in a case where the determination result inputted from the film voltage control section 60 is "Vdavg<Vth2" (Vth2<Vth3), the analog range control section 80 sets the analog range R to Ra (steps S204 and 201). That is, the analog range control section 80 causes the analog range R to be relatively smaller than Rb. Specifically, the analog range control section 80 outputs, to the ADC 40a, a control signal to set the analog range R to Ra. When the control signal to set the analog range R to Ra is inputted from the analog range control section 80, the ADC 40a sets the analog range R to Ra.

In a case where the determination result inputted from the film voltage control section 60 is "Vdavg≥Vth2", the analog range control section 80 executes step S202 when a command to finish the imaging is not inputted (steps S204 and 205). When the command to finish the imaging is inputted, the analog range control section 80 finishes the setting of the analog range R (step S205). In this manner, image quality adjustment of the imaging element 1 is performed.

[Effects]

In the present modification example, the application of the film voltage Vf based on the output of the imaging element 1 (average value Vdavg of the amplitude Vd of the pixel signal) to each photodiode PD (n-type semiconductor film 21) allows for control of the image quality of image data obtained from the pixel signal. Specifically, when the output of the imaging element 1 (average value Vdavg of the amplitude Vd of the pixel signal) exceeds the threshold value Vth1, the film voltage Vf is set relatively large, whereas, when the output of the imaging element 1 (average value Vdavg of the amplitude Vd of the pixel signal) falls below the threshold value Vth2, the film voltage Vf is set relatively small. In this manner, in the present modification example, at high luminance, the film voltage Vf is set relatively large to reduce an influence of the optical shot noise, whereas, at low luminance, the film voltage Vf is set relatively small to increase an S/N ratio. This makes it possible to suppress deterioration in image quality.

In the present modification example, outputting a range set value based on the pixel signal to the ADC 40a further allows for control of the image quality of image data obtained from the pixel signal. Specifically, when the output of the imaging element 1 (average value Vdavg of the amplitude Vd of the pixel signal) exceeds the threshold value Vth3, the range set value is set relatively large, whereas, when the output of the imaging element 1 (average value Vdavg of the amplitude Vd of the pixel signal) falls below the threshold value Vth2, the range set value is set relatively small. In this manner, in the present modification example, at high luminance, the range set value is set relatively large to suppress an overexposed highlight of an image, whereas, at low luminance, the range set value is set relatively small to increase an S/N ratio. This makes it possible to suppress deterioration in image quality.

Modification Example C

In the foregoing Modification Example B, the film voltage control section 60, the voltage generation circuit 70, and the analog range control section 80 are provided inside the imaging element 1, but may be provided inside the image quality control circuit 2, which is separated from the imaging element 1, for example, as illustrated in FIG. 12. In this case, the film voltage control section 60 may set the film voltage Vf on the basis of the output of the imaging element 1, for example, as illustrated in FIG. 12. Also in such a case, effects similar to those of the foregoing embodiment are achieved.

Modification Example D

In the foregoing Modification Example B, the film voltage control section 60, the voltage generation circuit 70, and the analog range control section 80 are provided inside the imaging element 1. However, the film voltage control section 60 and the voltage generation circuit 70 may be provided inside the image quality control circuit 2, which is separated from the imaging element 1, and the analog range control section 80 may be provided inside the imaging element 1, for example, as illustrated in FIG. 13.

In this case, the film voltage control section 60 may set the film voltage Vf on the basis of the output of the imaging element 1, for example, as illustrated in FIG. 13. In addition, the analog range control section 80 may set the analog range R of the ADC 40a on the basis of the values of the output voltages (Vtop and Vdr) of the voltage generation circuit 70, for example, as illustrated in FIG. 13.

In the present modification example, the film voltage Vf to be applied to each photodiode PD (n-type semiconductor film 21) is set on the basis of the output of the imaging element 1, and the analog range R of the ADC 40a is set on the basis of the values of the voltages (Vtop and Vdr) to be applied to each photodiode PD (n-type semiconductor film 21). This makes it possible to suppress deterioration in image quality.

Modification Example E

In the foregoing embodiment, the imaging element 1 may further include a conversion efficiency control section 90, for example, as illustrated in FIG. 14. The conversion efficiency control section 90 controls conversion efficiency η of the pixel circuit 14 on the basis of a determination result (i.e., output of the imaging element 1 (average value Vdavg of the amplitude Vd of the pixel signal)) inputted from the film voltage control section 60. Specifically, the conversion efficiency control section 90 outputs a control signal based on the determination result (i.e., output of the imaging element 1 (average value Vdavg of the amplitude Vd of the pixel signal)) inputted from the film voltage control section 60 to a switch element SW described later, to thereby control image quality of the image data obtained from the pixel signal.

FIG. 15 illustrates an example of a circuit configuration of the sensor pixel 11 according to the present modification example. In the sensor pixel 11 according to the present modification example, the pixel circuit 14 includes the switch element SW coupled to the floating diffusion FD, and an auxiliary capacitor Ce coupled in parallel to a capacitor (an FD capacitor Cfd) of the floating diffusion FD via the switch element SW. The conversion efficiency control section 90 controls ON/OFF of the switch element SW to thereby control the conversion efficiency η of the pixel circuit 14.

FIG. 16 illustrates an example of a relationship between the analog range R of the ADC 40a and the amplitude Vd of the pixel signal. FIG. 16 exemplifies a case where the analog range R of the ADC 40a is set to Rb.

In a case where the switch element SW is turned ON by the control of the conversion efficiency control section 90, a voltage generated by charges accumulated in the FD capacitor Cfd and the auxiliary capacitor Ce coupled in parallel to each other is inputted to the readout circuit 15. The conversion efficiency η of the pixel circuit 14 at this time is defined as $η_1$. In a case where the switch element SW is turned OFF by the control of the conversion efficiency control section 90, the auxiliary capacitor Ce is separated from the floating diffusion FD, and thus the voltage generated by the charges accumulated in the FD capacitor Cfd is inputted to the readout circuit 15. Conversion efficiency η2 of the pixel circuit 14 at this time becomes η1/α. Here, α is (Cfd+Ce)/Cfd). That is, turning OFF the switch element SW decreases the conversion efficiency η by 1/α. For example, in a case where the auxiliary capacitor Ce has twice the capacitance of the FD capacitor Cfd, the conversion efficiency η2 is ⅓ times the conversion efficiency η1. When the conversion efficiency η is decreased, the amplitude Vd of the pixel signal becomes smaller by an amount of the decrease in the conversion efficiency η, for example, as illustrated in FIG. 16. Therefore, for example, in a case where an average value Vdavg1 at the time when the switch element SW is turned ON is larger than the voltage value Vdb corresponding to the upper limit (Rb) of the analog range R of the ADC 40a to cause the ADC 40a to be saturated, turning OFF the switch element SW enables an average value Vdavg2 at the time of turning OFF the switch element SW to be Vdavg1/α, which is smaller than the voltage value Vdb. Therefore, at high luminance, the conversion efficiency η is set lower in order to prevent an overexposed highlight, whereas, at low luminance, a noise (dark current) is dominant, and thus setting the conversion efficiency η higher enables suppression of deterioration in image quality.

[Image Quality Adjustment]

Next, description is given, with reference to FIG. 17, of an image quality adjustment procedure of the imaging element 1. FIG. 17 illustrates an example of the image quality adjustment procedure of the imaging element 1. It is to be noted that, in the present modification example, the imaging element 1 executes the image quality adjustment procedure illustrated in FIG. 7, and executes the image quality adjustment procedure illustrated in FIG. 17.

The conversion efficiency control section 90 first sets the conversion efficiency η of the pixel circuit 14 to η1 (step S301). Specifically, the conversion efficiency control section 90 outputs, to the switch element SW inside the pixel circuit 14, a control signal to turn ON the switch element SW. The switch element SW is turned ON when the control signal to turn ON the switch element SW is inputted from the conversion efficiency control section 90. This causes the FD capacitor Cfd and the auxiliary capacitor Ce to be coupled in parallel to each other.

Next, in a case where the determination result inputted from the film voltage control section 60 is "Vdavg>Vth3", the conversion efficiency control section 90 sets the conversion efficiency η to η2 (η2<η1) (steps S302 and 303). At this time, the conversion efficiency control section 90 outputs, to the switch element SW, a control signal to turn OFF the switch element SW. The switch element SW is turned OFF when the control signal to turn off the switch element SW is inputted from the conversion efficiency control section 90. That is, the conversion efficiency control section 90 turns OFF the switch element SW when the average value Vdavg exceeds Vth3. This allows the auxiliary capacitor Ce to be separated from the floating diffusion FD.

In a case where the determination result inputted from the film voltage control section 60 is "Vdavg≤Vth3" or in a case where the switch element SW is set to OFF, the conversion efficiency control section 90 waits for a determination result of a magnitude relationship between the average value Vdavg and the threshold value Vth2 (Vth2<Vth3) to be inputted from the film voltage control section 60. At this time, in a case where the determination result inputted from the film voltage control section 60 is "Vdavg<Vth2", the conversion efficiency control section 90 sets the conversion efficiency η to η1 (steps S304 and 301). Specifically, the conversion efficiency control section 90 outputs, to the switch element SW, the control signal to turn ON the switch element SW. When the control signal to turn ON the switch element SW is inputted from the conversion efficiency control section 90, the switch element SW is turned ON. That is, the conversion efficiency control section 90 turns ON the switch element SW when the average value Vdavg falls below Vth2 smaller than Vth3. This allows the FD capacitor Cfd and the auxiliary capacitor Ce to be coupled in parallel to each other.

In a case where the determination result inputted from the film voltage control section 60 is "Vdavg≥Vth2", the conversion efficiency control section 90 executes step S302 when a command to finish the imaging is not inputted (steps S304 and 302). When the command to finish the imaging is inputted, the conversion efficiency control section 90 finishes the setting of the conversion efficiency η (step S305). In this manner, the image quality adjustment of the imaging element 1 is performed.

[Effects]

In the present modification example, the application of the film voltage Vf based on the output of the imaging element 1 (average value Vdavg of the amplitude Vd of the pixel signal) to each photodiode PD (n-type semiconductor film 21) allows for control of the image quality of image data obtained from the pixel signal. Specifically, when the output of the imaging element 1 (average value Vdavg of the amplitude Vd of the pixel signal) exceeds the threshold value Vth1, the film voltage Vf is set relatively large, whereas, when the output of the imaging element 1 (average value Vdavg of the amplitude Vd of the pixel signal) falls below the threshold value Vth2, the film voltage Vf is set relatively small. In this manner, in the present modification example, at high luminance, the film voltage Vf is set relatively large to reduce an influence of the optical shot noise, whereas, at low luminance, the film voltage Vf is set relatively small to increase an S/N ratio. This makes it possible to suppress deterioration in image quality.

In the present modification example, outputting a control signal based on the pixel signal to the switch element SW further allows for control of the image quality of image data obtained from the pixel signal. Specifically, when the output of the imaging element 1 (average value Vdavg of the amplitude Vd of the pixel signal) exceeds the threshold value Vth3, the switch element SW is turned OFF, whereas, when the output of the imaging element 1 (average value Vdavg of the amplitude Vd of the pixel signal) falls below the threshold value Vth2, the switch element SW is turned ON. In this manner, in the present modification example, at high luminance, the switch element SW is turned OFF to suppress an overexposed highlight of an image, whereas, at low luminance, the switch element SW is turned ON to increase an S/N ratio. This makes it possible to suppress deterioration in image quality.

Modification Example F

In the foregoing Modification Example E, the film voltage control section 60, the voltage generation circuit 70, and the conversion efficiency control section 90 are provided inside the imaging element 1. However, for example, as illustrated in FIG. 18, the film voltage control section 60, the voltage generation circuit 70, and the conversion efficiency control section 90 may be provided inside the image quality control circuit 2, which is separated from the imaging element 1. In this case, the film voltage control section 60 may set the film voltage Vf on the basis of the output of the imaging element 1, for example, as illustrated in FIG. 18. Also in such a case, effects similar to those of the foregoing embodiment are achieved.

Modification Example G

In the foregoing Modification Example E, the film voltage control section 60, the voltage generation circuit 70, and the conversion efficiency control section 90 are provided inside the imaging element 1. However, the film voltage control section 60 and the voltage generation circuit 70 may be provided inside the image quality control circuit 2, which is separated from the imaging element 1, and the conversion efficiency control section 90 may be provided inside the imaging element 1, for example, as illustrated in FIG. 19.

In this case, the film voltage control section 60 may set the film voltage Vf on the basis of the output of the imaging element 1, for example, as illustrated in FIG. 19. In addition, the conversion efficiency control section 90 may set the conversion efficiency η of the pixel circuit 14 on the basis of the values of the output voltages (Vtop and Vdr) of the voltage generation circuit 70, for example, as illustrated in FIG. 19.

In the present modification example, the film voltage Vf to be applied to the photodiode PD (n-type semiconductor film 21) is set on the basis of the output of the imaging element 1, and the conversion efficiency η of the pixel circuit 14 is set on the basis of the values of the voltages (Vtop and Vdr) to be applied to the photodiode PD (n-type semiconductor film 21). This makes it possible to suppress deterioration in image quality.

Modification Example H

In the foregoing embodiment and modification examples thereof, the discharge transistor OFG may be omitted in the pixel circuit 14, for example, as illustrated in FIGS. 20 and 21. At this time, the film voltage control section 60 may generate the voltage Vtop on the basis of the pixel signal to allow an electric potential difference (Vtop−Vdr) between the voltage Vtop to be applied to the n-type semiconductor layer 24 and the electrode Vdr of the p-type semiconductor layer 22 applied by the reset transistor RST when the transfer transistor TRG is turned ON, to be the film voltage Vf.

In addition, in the foregoing embodiment and modification examples thereof, the discharge transistor OFG and the transfer transistor TRG may be omitted in the pixel circuit 14, for example, as illustrated in FIGS. 22 and 23. At this time, the film voltage control section 60 may generate the voltage Vtop on the basis of the pixel signal to allow the electric potential difference (Vtop−Vdr) between the voltage Vtop to be applied to the n-type semiconductor layer 24 and the electrode Vdr of the p-type semiconductor layer 22 applied by the reset transistor RST, to be the film voltage Vf.

Also in such a case, effects similar to those of the imaging element 1 according to any of the foregoing embodiment and modification examples thereof are achieved in the present modification example.

Modification Example I

In the foregoing embodiment and modification examples A to H thereof, the light-receiving substrate 100 and the drive substrate 200 are bump-bonded. However, in the foregoing embodiment and modification examples A to H thereof, the light-receiving substrate 100 and the drive substrate 200 may be Cu—Cu-bonded. FIG. 24 illustrates a modification example of the cross-sectional configuration of the imaging element 1 according to the present modification example.

The light-receiving substrate 100 includes an insulating film 33, an embedding layer 34, interlayer insulating films 35 and 36, a plurality of electrodes 37 and a plurality of contact electrodes 38, instead of the passivation layer 28, the insulating layer 29, the plurality of coupling electrodes 31 and the plurality of bump electrodes 32.

The insulating film 33 covers the n-type semiconductor layer 23 and a portion of each of the p-type semiconductor layers 22, and has openings at locations facing the respective p-type semiconductor layers 22. The insulating film 33 includes, for example, an oxide such as silicone oxide ($SiO_x$) or aluminum oxide ($Al_2O_3$). The insulating film 33 may be configured by a multilayer structure including a plurality of films. The insulating film 33 may be configured by, for example, a silicon (Si)-based insulating material such as silicon oxynitride (SiON), carbon-containing silicon oxide (SiOC), silicon nitride (SiN) and silicon carbide (SiC). The insulating film 33 has a thickness of several dozen nm to several hundred nm, for example.

The plurality of electrodes 37 are provided one by one in the respective openings of the insulating film 33, and are provided one by one for the respective p-type semiconductor layers 22. The respective electrodes 37 are in contact with the corresponding p-type semiconductor layers 22. Each of the electrodes 37 is configured by, for example, a simple substance of any of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of those. Each of the electrodes 37 may be a single film of such a constituent material, or may be a stacked film in which two or more thereof are combined. For example, each of the electrodes 37 is configured by a stacked film of titanium and tungsten. Each of the electrodes 37 has a thickness of several dozen nm to several hundred nm, for example.

The embedding layer 34 is formed by embedding the electrodes 37. In the embedding layer 34, a surface on the side of the drive substrate 200 is planar. The embedding layer 34 is configured by, for example, an inorganic insulating material such as silicon oxide ($SiO_x$), silicon nitride (SiN), silicon oxynitride (SiON), carbon-containing silicon oxide (SiOC), and silicon carbide (SiC).

The interlayer insulating films 35 and 36 are stacked in this order on the planar surface, of the embedding layer 34, on the side of the drive substrate 200. The interlayer insulating films 35 and 36 are each configured by an inorganic insulating material, for example. Examples of the inorganic insulating material include silicon nitride (SiN), aluminum oxide ($Al_2O_3$), silicon oxide ($SiO_2$), and hafnium oxide ($HfO_2$). The interlayer insulating films 35 and 36 may be configured by the same inorganic insulating material.

The plurality of contact electrodes 38 are provided one by one for the respective electrodes 37. The respective electrodes 38 are in contact with the corresponding electrodes 37. A surface, of each contact electrode 38, on the side of the drive substrate 200 is exposed from the interlayer insulating film 36. The surface, of each contact electrode 38, on the side of the drive substrate 200 and a surface, of the interlayer insulating film 36, on the side of the drive substrate 200 are disposed in the same plane.

The drive substrate 200 includes a plurality of contact electrodes 47 instead of the plurality of coupling layers 43. The drive substrate 200 further includes interlayer insulating films 48 and 49. The plurality of contact electrodes 47 are provided one by one for the respective readout electrodes 44. The respective contact electrodes 47 are in contact with the corresponding readout electrodes 44.

The interlayer insulating films 48 and 49 are stacked in this order on a surface, of the interlayer insulating layer 42, on side of the light-receiving substrate 100. The interlayer insulating films 48 and 49 are each configured by an inorganic insulating material, for example. Examples of the inorganic insulating material include silicon nitride (SiN), aluminum oxide ($Al_2O_3$), silicon oxide ($SiO_2$), and hafnium oxide ($HfO_2$).

A surface, of each contact electrode 47, on the side of the light-receiving substrate 100 is exposed from the interlayer insulating film 49. The surface, of each contact electrode 47, on the side of the light-receiving substrate 100 and a surface, of the interlayer insulating film 49, on the side of the light-receiving substrate 100 are disposed in the same plane. The contact electrodes 38 and 47 are each configured by copper (Cu), for example. The contact electrode 38 and the contact electrode 47 are bonded to each other.

FIG. 25 illustrates an example of a planar configuration of the imaging element 1 according to the present modification example. FIG. 26 illustrates an example of a cross-sectional configuration of the imaging element 1 of FIG. 25 along a line A-A. The imaging element 1 includes an element region R1 at a middle part, and a peripheral region R2 provided outside the element region R1 and surrounding the element region R1. The element region R1 corresponds to a location, of the imaging element 1, where the n-type semiconductor film 21 (photodiode PD) is provided. The imaging element 1 includes an electrically-conductive film 51 provided from the element region R1 to the peripheral region R2. The electrically-conductive film 51 has openings in a region facing the middle part of the element region R1. A region, of the element region R1, exposed from the electrically-conductive film 51 (a region facing the opening of the electrically-conductive film 51) is a light-receiving region. A region, of the element region R1, covered with the electrically-conductive film 51 is an OPB (Optical Black) region. The OPB region is provided to surround the light-receiving region. The OPB region is used to obtain a black-level pixel signal.

In the light-receiving substrate 100, the insulating film 33 covers the n-type semiconductor layer 23 and a portion of each of the p-type semiconductor layers 22, and covers a side surface of the n-type semiconductor film 21 (photodiode PD). In the light-receiving substrate 100, the embedding layer 34 covers the side surface of the n-type semiconductor film 21 with the insulating film 33 interposed therebetween, and is provided from the element region R1 to the peripheral region R2. The peripheral region R2 is provided with holes H1 and H2 that penetrate the light-receiving substrate 100 to reach the drive substrate 200.

The hole H1 is provided at a position closer to the element region R1 than the hole H2, and a side wall and a bottom surface of the hole H1 are covered with the electrically-conductive film 51. The hole H1 serves to couple the n-type semiconductor film 21 and the wiring line 46 of the drive substrate 200 together, and is provided to penetrate the antireflection film 25, the embedding layer 34, the interlayer insulating film 35, and the interlayer insulating film 36.

The hole H2 is provided, for example, at a position closer to an end part of the light-receiving substrate 100 than the hole H1. The hole H2 penetrates the antireflection film 25, the embedding layer 34, the interlayer insulating film 35 and the interlayer insulating film 36 to reach the wiring line 46 of the drive substrate 200. The outside and the imaging element 1 are electrically coupled together via the hole H2. The holes H1 and H2 need not reach the drive substrate 200. For example, the holes H1 and H2 may reach a wiring line provided in the interlayer insulating film 36, and the wiring line may be coupled to the wiring line 46 of the drive substrate 200.

In the light-receiving substrate 100, the interlayer insulating film 36, the interlayer insulating film 35, and the embedding layer 34 are provided in this order from a position close to the drive substrate 200. The interlayer insulating film 36, the interlayer insulating film 35, and the embedding layer 34 are provided from the element region R1 to the peripheral region R2, and the interlayer insulating film 36 and each contact electrode 38 constitute a bonding surface with the drive substrate 200. The bonding surface of the light-receiving substrate 100 is provided in the element region R1 and the peripheral region R2, and the bonding surface in the element region R1 and the bonding surface in the peripheral region R2 constitute the same plane.

A plurality of contact electrodes 38 provided in the peripheral region R2, of the plurality of contact electrodes 38 provided in the light-receiving substrate 100, have no electrical coupling to the n-type semiconductor film 21 (photodiode PD), and are each a dummy electrode 38D provided for bonding between the light-receiving substrate 100 and the drive substrate 200.

In the drive substrate 200, the interlayer insulating film 49, the interlayer insulating film 48, and the interlayer insulating layer 42 are provided in this order from a position close to the light-receiving substrate 100. The interlayer insulating films 49, the interlayer insulating film 48, and the interlayer insulating layer 42 are provided from the element region R1 to the peripheral region R2, and the interlayer insulating film 49 and each contact electrode 47 constitute a bonding surface with the light-receiving substrate 100. The bonding surface of the drive substrate 200 is provided in the element region R1 and the peripheral region R2, and the bonding surface in the element region R1 and the bonding surface in the peripheral region R2 constitute the same plane.

A plurality of contact electrodes 47 provided in the peripheral region R2, of the plurality of contact electrodes 47 provided in the drive substrate 200, have no electrical coupling to the n-type semiconductor film 21 (photodiode PD), and are each a dummy electrode 47D provided for bonding between the light-receiving substrate 100 and the drive substrate 200. The dummy electrode 47D is provided at a position facing the dummy electrode 38D, and is bonded to the dummy electrode 38D provided at the facing position. This makes it possible to improve strength of the peripheral region R2.

The electrically-conductive film 51 is provided from the OPB region to the hole H1 in the peripheral region R2. The electrically-conductive film 51 is in contact with the n-type semiconductor layer 24 in an opening 25H of the antireflection film 25 provided in the OPB region, and is in contact with the wiring line 46 of the drive substrate 200 via the hole H1. This allows a voltage to be supplied from the drive substrate 200 to the n-type semiconductor layer 24 via the electrically-conductive film 51. The electrically-conductive film 51 functions as a voltage-supplying path to the n-type semiconductor layer 24, and also has a function as a light-shielding film to form the OPB region. The electrically-conductive film 51 is configured by, for example, a metal material containing tungsten (W), aluminum (Al), titanium (Ti), molybdenum (Mo), tantalum (Ta), or copper (Cu). A passivation film 52 may be provided on the electrically-conductive film 51.

3. Second Embodiment

FIG. 27 illustrates an example of a schematic configuration of an imaging apparatus 3 including the imaging element 1 (hereinafter, referred to as an "imaging element 1a") according to the foregoing embodiment, Modification Example B, Modification Example E, and Modification Example H.

The imaging apparatus 3 is an electronic apparatus including, for example, an imaging apparatus such as a digital still camera or a video camera, or a portable terminal apparatus such as a smartphone or a tablet-type terminal. The imaging apparatus 3 includes, for example, the imaging element 1a, an optical system 141, a shutter device 142, a DSP circuit 143, a frame memory 144, a display unit 145, a storage unit 146, an operation unit 147, and a power source unit 148. In the imaging apparatus 3, the imaging element 1a, the shutter device 142, the DSP circuit 143, the frame memory 144, the display unit 145, the storage unit 146, the operation unit 147, and the power source unit 148 are coupled to one another via a bus line 149.

The imaging element 1a outputs image data (digital value) corresponding to incident light. The optical system 141 includes one or a plurality of lenses, and guides light (incident light) from a subject to the imaging element 1a to form an image on a light-receiving surface of the imaging element 1a. The shutter device 142 is disposed between the optical system 141 and the imaging element 1a, and controls periods of light irradiation and light shielding with respect to the imaging element 1a. The DSP circuit 143 is a signal processing circuit that processes the image data (digital value) outputted from the imaging element 1a. The frame memory 144 temporarily holds the image data processed by the DSP circuit 143 in a frame unit. The display unit 145 includes, for example, a panel-type display device such as a liquid crystal panel or an organic EL (Electro Luminescence) panel, and displays a moving image or a still image captured by the imaging element 1a. The storage unit 146 records image data of a moving image or a still image captured by the imaging element 1a in a recording medium such as a semiconductor memory or a hard disk. The operation unit 147 issues an operation command for various functions of the imaging apparatus 3 in accordance with an operation by a user. The power source unit 148 appropriately supplies various types of power for operation to the imaging element 1a, the shutter device 142, the DSP circuit 143, the frame memory 144, the display unit 145, the storage unit 146, and the operation unit 147 which are supply targets.

Next, description is given of an example of an imaging procedure in the imaging apparatus 3.

FIG. 28 illustrates an example of a flowchart of an imaging operation in the imaging apparatus 3. A user instructs start of imaging by operating the operation unit 147 (step S401). Then, the operation unit 147 transmits an imaging command to the imaging element 1a (step S402). In the imaging apparatus 3, the imaging element 1a performs various settings (e.g., image quality adjustment described above, etc.) upon receiving the imaging command (step S403). Thereafter, the imaging element 1a executes imaging in a predetermined imaging method (step S404). It is to be noted that, in the imaging apparatus 3, the imaging element 1a repeatedly executes step S403 and step S404 as necessary.

The imaging element 1a outputs image data obtained by the imaging to the DSP circuit 143. As used herein, the image data refers to data for all pixels of pixel signals generated on the basis of charges temporarily held in the floating diffusion FD. The DSP circuit 143 performs predetermined signal processing (e.g., noise reduction processing, etc.) on the basis of the image data inputted from the imaging element 1a (step S405). The DSP circuit 143 causes the frame memory 144 to hold the image data having been subjected to the predetermined signal processing, and the frame memory 144 causes the storage unit 146 to store the image data (step S406). In this manner, the imaging in the imaging apparatus 3 is performed.

In the present embodiment, the imaging element 1a is applied to the imaging apparatus 3. This makes it possible to automatically perform image quality adjustment of the imaging element 1a.

4. Modification Example of Second Embodiment

In the foregoing second embodiment, the imaging apparatus 3 may include, instead of the imaging element 1a, the imaging element 1 (hereinafter, referred to as an "imaging element 1b") according to the foregoing Modification Example A, Modification Example C, Modification Example D, Modification Example F, Modification Example G, and Modification Example H. In this case, the imaging apparatus 3 may include, for example, the image quality control circuit 2, as illustrated in FIG. 29. Also in such a case, it is possible to automatically perform image quality adjustment of the imaging element 1b, similarly to the foregoing application example.

5. Practical Application Examples

Practical Application Example 1

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 30 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 30, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 30, an audio speaker 12061, a display section 12062, and an instrument panel 12063 are illustrated as the output device. The display section 12062 may, for example, include at least one of an on-board display and a head-up display.

FIG. 31 is a diagram depicting an example of the installation position of the imaging section 12031.

In FIG. 31, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 31 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the imaging apparatus 3 is applicable to the imaging section 12031. The application of the technology according to an embodiment of the present disclosure to the imaging section 12031 enables obtainment of a high image-quality captured image, thus making it possible to perform highly accurate control utilizing the captured image in the mobile body control system.

Practical Application Example 2

FIG. 32 is a view depicting an example of a schematic configuration of an endoscopic surgery system to which the technology according to an embodiment of the present disclosure (present technology) can be applied.

In FIG. 32, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 33 is a block diagram depicting an example of a functional configuration of the camera head 11102 and the CCU 11201 depicted in FIG. 32.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided correspondingly to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is suitably applicable to, for example, the image pickup unit 11402 provided in the camera head 11102 of the endoscope 11100, among the configurations described above. Applying the technology according to an embodiment of the present disclosure to the image pickup unit 11402 enables obtainment of a high image-quality captured image, thus making it possible to provide the high image-quality endoscope 11100.

Although the description has been given hereinabove of the present disclosure with reference to the embodiments and modification examples thereof, the application example, and the practical application examples, the present disclosure is not limited to the embodiments, etc., and may be modified in a wide variety of ways. It is to be noted that the effects described herein are merely illustrative. The effects of the present disclosure are not limited to those described herein.

The present disclosure may have other effects than those described herein.

In addition, for example, the present disclosure may have the following configurations.

(1)

An imaging element including:

a plurality of sensor pixels each including a photoelectric conversion section, and a readout circuit that outputs a pixel signal based on charges outputted from the photoelectric conversion section; and a voltage control section that applies a control voltage based on the pixel signal to each photoelectric conversion section.

(2)

The imaging element according to (1), in which
the voltage control section causes the control voltage to be relatively large when the pixel signal exceeds a first threshold value, and
the voltage control section causes the control voltage to be relatively small when the pixel signal falls below a second threshold value smaller than the first threshold value.

(3)

The imaging element according to (1) or (2), in which
each of the sensor pixels further includes a first electrode and a second electrode that sandwich the photoelectric conversion section, and
the voltage control section generates a first voltage to be applied to the first electrode and a second voltage to be applied to the second electrode on a basis of the pixel signal to allow an electric potential difference between the first voltage and the second voltage to be the control voltage.

(4)

The imaging element according to (3), in which
each of the sensor pixels further includes
a charge-holding section that holds charges transferred from the photoelectric conversion section,
a transfer transistor that is electrically coupled to the second electrode, and transfers charges from the photoelectric conversion section to the charge-holding section, and
a discharge transistor that is electrically coupled to the second electrode, and initializes charges of the photoelectric conversion section, and
the voltage control section applies the second voltage to the second electrode when the discharge transistor is turned ON.

(5)

The imaging element according to (1) or (2), in which
each of the pixels further includes
a first electrode and a second electrode that sandwich the photoelectric conversion section,
a charge-holding section that holds charges transferred from the photoelectric conversion section, and
a transfer transistor that is electrically coupled to the second electrode, and transfers charges from the photoelectric conversion section to the charge-holding section,
the readout circuit includes a reset transistor that initializes an electric potential of the charge-holding section, and
the voltage control section generates a first voltage to be applied to the first electrode on a basis of the pixel signal to allow an electric potential difference between the first voltage and a second voltage of the second electrode applied by the reset transistor when the transfer transistor is turned ON, to be the control voltage.

(6)

The imaging element according to (1) or (2), in which
each of the pixels further includes a charge-holding section that holds charges transferred from the photoelectric conversion section,
the readout circuit includes a reset transistor that initializes an electric potential of the charge-holding section, and
the voltage control section generates a first voltage to be applied to the first electrode on a basis of the pixel signal to allow an electric potential difference between the first voltage and a second voltage of the second electrode applied by the reset transistor, to be the control voltage.

(7)

The imaging element according to any one of (1) to (6), further including:
an Analog-to-Digital conversion circuit that performs AD conversion of the pixel signal; and
a range control section that outputs a range set value based on the pixel signal to the Analog-to-Digital conversion circuit.

(8)

The imaging element according to (7), in which
the range control section causes the range set value to be relatively large when the pixel signal exceeds the first threshold value, and
the range control section causes the range set value to be relatively small when the pixel signal falls below the second threshold value smaller than the first threshold value.

(9)

The imaging element according to any one of (1) to (6), in which
each of the sensor pixels further includes
the charge-holding section that holds charges transferred from the photoelectric conversion section,
the transfer transistor that transfers charges from the photoelectric conversion section to the charge-holding section,
a switch element coupled to the charge-holding section,
an auxiliary capacitor coupled in parallel to a capacitor of the charge-holding section via the switch element, and
a conversion efficiency control section that controls ON/OFF of the switch element on a basis of the pixel signal.

(10)

The imaging element according to (9), in which
the conversion efficiency control section turns OFF the switch element when the pixel signal exceeds the first threshold value, and
the conversion efficiency control section turns ON the switch element when the pixel signal falls below the second threshold value smaller than the first threshold value.

(11)

An imaging apparatus including:
an imaging element including
a plurality of sensor pixels each including a photoelectric conversion section, and a readout circuit that outputs a pixel signal based on charges outputted from the photoelectric conversion section; and
an image quality control circuit that applies a control voltage based on the pixel signal to each photoelectric conversion section.

According to the imaging element and the imaging apparatus according to respective embodiments of the present disclosure, the control voltage based on the pixel signal is applied to each photoelectric conversion section, thus making it possible to perform image quality adjustment according to magnitude of luminance of the image data, as compared with a case where a fixed voltage is applied to each photoelectric conversion section. Thus, it is possible to suppress deterioration in the image quality. It is to be noted that the effects of the present disclosure are not necessarily limited to the effects described here, and may be any of the effects described herein.

This application claims the benefit of Japanese Priority Patent Application JP2019-043786 filed with the Japan Patent Office on Mar. 11, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging element, comprising:
a plurality of sensor pixels, wherein
  each sensor pixel of the plurality of sensor pixels includes:
    a photoelectric conversion section configured to output charges,
    a readout circuit configured to output a pixel signal based on the charges outputted from the photoelectric conversion section, and
    a first electrode and a second electrode that sandwich the photoelectric conversion section; and
a voltage control section configured to:
  apply a control voltage based on the pixel signal to each photoelectric conversion section; and
  generate a first voltage and a second voltage based on the pixel signal, wherein
    the first voltage is applied to the first electrode and the second voltage is applied to the second electrode, and
    an electric potential difference between the first voltage and the second voltage is equal to the control voltage.

2. The imaging element according to claim 1, wherein
the voltage control section is further configured to cause-causes the control voltage to be relatively large when the pixel signal exceeds a first threshold value, and
the voltage control section is further configured to cause-causes the control voltage to be relatively small when the pixel signal falls below a second threshold value smaller than the first threshold value.

3. The imaging element according to claim 1, wherein
each sensor pixel of the plurality of sensor pixels further includes;
  a charge-holding section configured to hold the charges outputted from the photoelectric conversion section,
  a transfer transistor electrically coupled to the second electrode, wherein the transfer transistor is configured to transfer charges from the photoelectric conversion section to the charge-holding section, and
  a discharge transistor that is electrically coupled to the second electrode, wherein the discharge transistor is configured to initialize charges of the photoelectric conversion section, and
the voltage control section is further configured to apply the second voltage to the second electrode based on the discharge transistor is ON.

4. The imaging element according to claim 1, further comprising:
an Analog-to-Digital conversion circuit configured to perform AD conversion of the pixel signal; and
a range control section configured to output a range set value based on the pixel signal to the Analog-to-Digital conversion circuit.

5. The imaging element according to claim 4, wherein
the range control section is further configured to cause the range set value to be relatively large based on the pixel signal exceeds a first threshold value, and
the range control section is further configured to cause the range set value to be relatively small based on the pixel signal falls below a second threshold value smaller than the first threshold value.

6. The imaging element according to claim 1, wherein
each sensor pixel of the plurality of sensor pixels further includes
  a charge-holding section configured to hold charges outputted from the photoelectric conversion section,
  a transfer transistor configured to transfer charges from the photoelectric conversion section to the charge-holding section,
  a switch element coupled to the charge-holding section,
  an auxiliary capacitor coupled in parallel to a capacitor of the charge-holding section via the switch element, and
  a conversion efficiency control section configured to control ON/OFF of the switch element based on the pixel signal.

7. The imaging element according to claim 6, wherein the conversion efficiency control section is further configured to:
turn OFF the switch element based on the pixel signal exceeds a first threshold value, and
turn ON the switch element based on the pixel signal falls below a second threshold value smaller than the first threshold value.

8. An imaging apparatus, comprising:
an imaging element including;
  a plurality of sensor pixels, wherein
    each sensor pixel of the plurality of sensor pixels includes:
      a photoelectric conversion section configured to output charges,
      a readout circuit configured to output a pixel signal based on the charges outputted from the photoelectric conversion section, and
      a first electrode and a second electrode that sandwich the photoelectric conversion section; and
  an image quality control circuit configured to:
    apply a control voltage based on the pixel signal to each photoelectric conversion section; and
    generate a first voltage and a second voltage based on the pixel signal, wherein
      the first voltage is applied to the first electrode and the second voltage is applied to the second electrode, and
      an electric potential difference between the first voltage and the second voltage is equal to the control voltage.

9. An imaging element, comprising:
a plurality of sensor pixels, wherein
  each sensor pixel of the plurality of sensor pixels includes:
    a photoelectric conversion section configured to output charges,
    a readout circuit configured to output a pixel signal based on the charges outputted from the photoelectric conversion section, a first electrode and a second electrode that sandwich the photoelectric conversion section, a charge-holding section configured to hold the charges outputted from the photoelectric conversion section, and a transfer transistor that is electrically coupled to the second electrode, the readout circuit includes a reset transistor configured to initialize an electric potential of the charge-holding section, and the transfer transistor is configured to transfer charges from the photoelectric conversion section to the charge-holding section; and a voltage control section configured to:

apply a control voltage based on the pixel signal to each photoelectric conversion section; and generate, based on the pixel signal, a first voltage to be applied to the first electrode, wherein the control voltage is an electric potential difference between the first voltage and a second voltage of the second electrode applied by the reset transistor based on the transfer transistor is ON.

10. An imaging element, comprising:

a plurality of sensor pixels, wherein each sensor pixel of the plurality of sensor pixels includes:

a photoelectric conversion section configured to output charges, a readout circuit configured to output a pixel signal based on the charges outputted from the photoelectric conversion section, and a charge-holding section configured to hold the charges outputted from the photoelectric conversion section, and the readout circuit includes a reset transistor configured to initialize an electric potential of the charge-holding section;

and a voltage control section configured to:

apply a control voltage based on the pixel signal to each photoelectric conversion section;

and generate, based on the pixel signal, a first voltage to be applied to a first electrode, wherein the control voltage is an electric potential difference between the first voltage and a second voltage of a second electrode applied by the reset transistor.

* * * * *